US012735785B2

(12) United States Patent
Antony et al.

(10) Patent No.: US 12,735,785 B2
(45) Date of Patent: Sep. 15, 2026

(54) HIGH SELECTIVITY, LOW STRESS, AND LOW HYDROGEN CARBON HARDMASKS IN LOW-PRESSURE CONDITIONS WITH WIDE GAP ELECTRODE SPACING

(71) Applicant: Lam Research Corporation, Fremont, CA (US)

(72) Inventors: Abbin Antony, Beaverton, OR (US); Xin Meng, Ontario, CA (US); Xinyi Chen, Beaverton, OR (US); Sreeram Sonti, San Diego, CA (US); Kapu Sirish Reddy, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 247 days.

(21) Appl. No.: 18/256,893

(22) PCT Filed: Dec. 13, 2021

(86) PCT No.: PCT/US2021/063109
§ 371 (c)(1),
(2) Date: Jun. 9, 2023

(87) PCT Pub. No.: WO2022/132642
PCT Pub. Date: Jun. 23, 2022

(65) Prior Publication Data

US 2024/0030028 A1 Jan. 25, 2024

Related U.S. Application Data

(60) Provisional application No. 63/199,322, filed on Dec. 18, 2020.

(51) Int. Cl.
*C23C 16/22* (2006.01)
*C23C 16/26* (2006.01)
(Continued)

(52) U.S. Cl.
CPC .............. *C23C 16/22* (2013.01); *C23C 16/26* (2013.01); *C23C 16/45512* (2013.01);
(Continued)

(58) Field of Classification Search
None
See application file for complete search history.

(56) References Cited

U.S. PATENT DOCUMENTS 2,146,448 A 2/1939 Scott et al.
2,405,693 A 8/1946 Hamill et al.
(Continued)

FOREIGN PATENT DOCUMENTS

CN 1877450 A 12/2006
CN 1914715 A 2/2007
(Continued)

OTHER PUBLICATIONS

CN Office Action dated Dec. 26, 2024 in CN Application No. 202080061227.0, with English Translation.
(Continued)

*Primary Examiner* — Jiong-Ping Lu
(74) *Attorney, Agent, or Firm* — Weaver Austin Villeneuve & Sampson LLP

(57) ABSTRACT

Provided herein are methods and related apparatus for depositing an ashable hard mask (AHM) on a substrate by providing a wide gap electrode spacing in low-pressure conditions. A wide gap electrode may facilitate control of parasitic plasmas in low-pressure conditions, thereby enabling formation of high selectivity, low stress, and low-hydrogen AHMs. The AHM may then be used to etch features into underlying layers of the substrate.

14 Claims, 8 Drawing Sheets

(51) Int. Cl.

| | |
|---|---|
| ***C23C 16/455*** | (2006.01) |
| ***C23C 16/458*** | (2006.01) |
| ***C23C 16/50*** | (2006.01) |
| ***C23C 16/52*** | (2006.01) |
| ***C23C 16/56*** | (2006.01) |
| ***H01J 37/32*** | (2006.01) |
| ***H10P 14/60*** | (2026.01) |
| ***H10P 14/68*** | (2026.01) |
| ***H10P 14/69*** | (2026.01) |
| ***H10P 50/00*** | (2026.01) |
| ***H10P 76/00*** | (2026.01) |
| ***H10P 76/40*** | (2026.01) |

(52) U.S. Cl.

CPC .. *C23C 16/45561* (2013.01); *C23C 16/45565* (2013.01); *C23C 16/4583* (2013.01); *C23C 16/50* (2013.01); *C23C 16/52* (2013.01); *C23C 16/56* (2013.01); *H01J 37/32715* (2013.01); *H10P 14/6334* (2026.01); *H10P 14/6336* (2026.01); *H10P 14/668* (2026.01); *H10P 14/683* (2026.01); *H10P 14/6902* (2026.01); *H10P 50/692* (2026.01); *H10P 76/00* (2026.01); *H10P 76/4085* (2026.01); *H01J 2237/20235* (2013.01); *H01J 2237/3321* (2013.01)

(56) References Cited

U.S. PATENT DOCUMENTS 3,816,976 A 6/1974 Stork et al.
4,209,357 A 6/1980 Gorin et al.
4,274,841 A 6/1981 Andresen et al.
4,668,261 A 5/1987 Chatzipetros et al.
4,673,589 A 6/1987 Standley
4,863,493 A 9/1989 Kotani et al.
4,863,760 A 9/1989 Schantz et al.
4,975,144 A 12/1990 Yamazaki et al.
5,022,959 A 6/1991 Itoh et al.
5,222,549 A 6/1993 Ishii et al.
5,231,057 A 7/1993 Doki et al.
5,261,250 A 11/1993 Missimer
5,378,316 A 1/1995 Franke et al.
5,419,804 A 5/1995 Ojha et al.
5,470,661 A 11/1995 Bailey et al.
5,562,952 A 10/1996 Nakahigashi et al.
5,670,066 A 9/1997 Barnes et al.
5,792,269 A 8/1998 Deacon et al.
5,900,288 A 5/1999 Kuhman et al.
5,948,704 A 9/1999 Benjamin et al.
5,968,379 A 10/1999 Zhao et al.
5,985,103 A 11/1999 Givens et al.
6,006,797 A 12/1999 Bulow et al.
6,030,591 A 2/2000 Tom et al.
6,035,803 A 3/2000 Robles et al.
6,041,734 A 3/2000 Raoux et al.
6,066,209 A 5/2000 Sajoto et al.
6,114,259 A 9/2000 Sukharev et al.
6,150,719 A 11/2000 Saia et al.
6,241,793 B1 6/2001 Lee et al.
6,286,321 B1 9/2001 Glater
6,319,299 B1 11/2001 Shih et al.
6,331,480 B1 12/2001 Tsai et al.
6,367,413 B1 4/2002 Sill et al.
6,387,819 B1 5/2002 Yu
6,422,918 B1 7/2002 Avanzino et al.
6,458,516 B1 10/2002 Ye et al.
6,465,051 B1 10/2002 Sahin et al.
6,478,924 B1 11/2002 Shamouilian et al.
6,541,397 B1 4/2003 Bencher
6,573,030 B1 6/2003 Fairbairn et al.
6,613,434 B1 9/2003 Drevillon et al.
6,617,553 B2 9/2003 Ho et al.
6,635,185 B2 10/2003 Demmin et al.
6,777,349 B2 8/2004 Fu et al.
6,787,452 B2 9/2004 Sudijono et al.
6,787,819 B2 9/2004 Rhodes et al.
6,884,733 B1 4/2005 Dakshina-Murthy et al.
6,967,072 B2 11/2005 Latchford et al.
6,984,591 B1 1/2006 Buchanan et al.
7,063,742 B1 6/2006 Ando et al.
7,064,078 B2 6/2006 Liu et al.
7,202,176 B1 4/2007 Goto et al.
7,205,228 B2 4/2007 Padhi et al.
7,220,982 B2 5/2007 Campbell
7,223,526 B2 5/2007 Fairbairn et al.
7,235,478 B2 6/2007 Geng et al.
7,271,106 B2 9/2007 Abatchev et al.
7,288,484 B1 10/2007 Goto et al.
7,314,506 B2 1/2008 Vininski et al.
7,323,401 B2 1/2008 Ramaswamy et al.
7,381,644 B1 6/2008 Subramonium et al.
7,399,712 B1 7/2008 Graff
7,407,893 B2 8/2008 Seamons et al.
7,495,984 B2 2/2009 Kim et al.
7,576,009 B2 8/2009 Lee et al.
7,637,269 B1 12/2009 Zin et al.
7,732,728 B2 6/2010 Dhindsa et al.
7,740,736 B2 6/2010 Fischer et al.
7,781,351 B1 8/2010 Wu et al.
7,803,715 B1 9/2010 Haimson et al.
7,820,556 B2 10/2010 Hsu et al.
7,915,166 B1 3/2011 Yu et al.
7,955,990 B2 6/2011 Henri et al.
7,981,777 B1 7/2011 Subramonium et al.
7,981,810 B1 7/2011 Subramonium et al.
8,110,493 B1 2/2012 Subramonium et al.
8,114,782 B2 2/2012 Graff
8,129,281 B1 3/2012 Cheung et al.
8,227,352 B2 7/2012 Yu et al.
8,309,473 B2 11/2012 Hsu et al.
8,361,906 B2 1/2013 Lee et al.
8,435,608 B1 5/2013 Subramonium et al.
8,563,414 B1 10/2013 Fox et al.
8,569,179 B2 10/2013 Graff
8,664,124 B2 3/2014 Graff
8,669,181 B1 3/2014 Yu et al.
8,962,101 B2 2/2015 Subramonium et al.
9,240,320 B1 1/2016 Subramonium et al.
9,304,396 B2 4/2016 Shamma et al.
9,320,387 B2 4/2016 Reddy et al.
9,543,148 B1 1/2017 Hudson et al.
9,589,799 B2 3/2017 Reddy et al.
9,618,846 B2 4/2017 Shamma et al.
11,837,441 B2 12/2023 Weimer et al.
12,435,412 B2 10/2025 Weimer et al.
2001/0021491 A1 9/2001 Chen et al.
2002/0182848 A1 12/2002 Joseph et al.
2002/0185151 A1 12/2002 Qingyuan et al.
2003/0044532 A1 3/2003 Lee et al.
2003/0106647 A1 6/2003 Koshiishi et al.
2003/0119307 A1 6/2003 Bekiaris et al.
2003/0124859 A1 7/2003 Cheung et al.
2004/0000534 A1 1/2004 Lipinski
2004/0016972 A1 1/2004 Singh et al.
2004/0018750 A1 1/2004 Sophie et al.
2004/0023502 A1 2/2004 Tzou et al.
2004/0058517 A1 3/2004 Nallan et al.
2004/0140506 A1 7/2004 Singh et al.
2004/0180551 A1 9/2004 Biles et al.
2004/0224504 A1 11/2004 Gadgil
2004/0266195 A1 12/2004 Dokumaci et al.
2005/0042889 A1 2/2005 Lee et al.
2005/0054202 A1 3/2005 Pan et al.
2005/0098119 A1 5/2005 Burger et al.
2005/0112506 A1 5/2005 Czech et al.
2005/0129935 A1 6/2005 Kunitake et al.
2005/0130404 A1 6/2005 Moghadam et al.
2005/0142361 A1 6/2005 Nakanishi et al.
2005/0167394 A1 8/2005 Liu et al.
2005/0202683 A1 9/2005 Wang et al.
2005/0260411 A1 11/2005 Ravi

(56) References Cited

U.S. PATENT DOCUMENTS

2005/0287771 A1 12/2005 Seamons et al.
2006/0019486 A1 1/2006 Yu et al.
2006/0024945 A1 2/2006 Kim et al.
2006/0046483 A1 3/2006 Abatchev et al.
2006/0091559 A1 5/2006 Nguyen et al.
2006/0105577 A1 5/2006 Donohoe et al.
2006/0154086 A1 7/2006 Fuller et al.
2006/0154477 A1 7/2006 Geng et al.
2006/0197881 A1 9/2006 Kang et al.
2006/0205223 A1 9/2006 Smayling
2006/0231524 A1 10/2006 Liu et al.
2006/0246373 A1 11/2006 Wang
2007/0032054 A1 2/2007 Ramaswamy et al.
2007/0032082 A1 2/2007 Ramaswamy et al.
2007/0048674 A1 3/2007 Wells
2007/0054500 A1 3/2007 Bencher
2007/0059913 A1 3/2007 King et al.
2007/0072112 A1 3/2007 Prokopowicz et al.
2007/0077780 A1 4/2007 Wang et al.
2007/0087520 A1 4/2007 Mitsuiki et al.
2007/0105303 A1 5/2007 Busch et al.
2007/0125762 A1 6/2007 Cui et al.
2007/0128538 A1 6/2007 Fairbairn et al.
2007/0134917 A1 6/2007 Li et al.
2007/0140029 A1 6/2007 Kim et al.
2007/0166546 A1 7/2007 Ichikawa et al.
2007/0166979 A1 7/2007 Wang et al.
2007/0202640 A1 8/2007 Al-Bayati et al.
2007/0245960 A1 10/2007 Paterson et al.
2007/0247073 A1 10/2007 Paterson et al.
2007/0249172 A1 10/2007 Huang et al.
2007/0275560 A1 11/2007 Nishimura et al.
2008/0073636 A1 3/2008 Kim
2008/0083916 A1 4/2008 Kim
2008/0085606 A1 4/2008 Fischer et al.
2008/0128907 A1 6/2008 Yang et al.
2008/0200003 A1 8/2008 Hong et al.
2008/0211118 A1 9/2008 Wyse et al.
2008/0242912 A1 10/2008 Letessier et al.
2008/0254639 A1 10/2008 Graff
2008/0254641 A1 10/2008 Kobayashi et al.
2008/0264803 A1 10/2008 Agrawal
2009/0176174 A1 7/2009 Chen et al.
2009/0182180 A1 7/2009 Huang et al.
2009/0286402 A1 11/2009 Xia et al.
2009/0294062 A1 12/2009 Shannon et al.
2009/0305516 A1 12/2009 Hsu et al.
2010/0032838 A1 2/2010 Kikuchi et al.
2010/0151691 A1 6/2010 Henri et al.
2010/0197558 A1 8/2010 Miralles et al.
2010/0297853 A1 11/2010 Hsu et al.
2011/0236594 A1 9/2011 Haverkamp et al.
2011/0236600 A1 9/2011 Fox et al.
2011/0244142 A1 10/2011 Cheng et al.
2011/0287633 A1 11/2011 Lee et al.
2012/0121764 A1 5/2012 Lai et al.
2012/0149207 A1 6/2012 Graff
2012/0164836 A1 6/2012 Chumakov
2012/0196446 A1 8/2012 Graff
2012/0258261 A1 10/2012 Reddy et al.
2013/0109188 A1 5/2013 Kim et al.
2013/0216956 A1 8/2013 Kishioka et al.
2013/0333616 A1 12/2013 Klindworth et al.
2014/0057442 A1 2/2014 Lee et al.
2014/0057454 A1 2/2014 Subramonium et al.
2014/0113457 A1 4/2014 Sims et al.
2014/0199628 A1 7/2014 Edelstein et al.
2014/0239462 A1 8/2014 Shamma et al.
2014/0273469 A1 9/2014 Wahl et al.
2014/0273473 A1 9/2014 Schmid et al.
2015/0093908 A1 4/2015 Reddy et al.
2015/0093915 A1 4/2015 Reddy et al.
2015/0179466 A1 6/2015 Takayama et al.
2015/0287612 A1 10/2015 Luere et al.
2016/0179005 A1 6/2016 Shamma et al.
2016/0225588 A1 8/2016 Shaikh et al.
2016/0225632 A1 8/2016 Shaikh et al.
2016/0254171 A1 9/2016 Shamma et al.
2016/0281230 A1 9/2016 Varadarajan et al.
2016/0314960 A1 10/2016 Cheng et al.
2016/0314986 A1 10/2016 Tominaga et al.
2016/0343580 A1 11/2016 Hudson
2017/0178920 A1 6/2017 Dole et al.
2018/0068852 A1 3/2018 Cottle et al.
2018/0144903 A1* 5/2018 Shaikh .............. C23C 16/45565
2018/0286707 A1 10/2018 Hudson et al.
2018/0358220 A1 12/2018 Yu et al.
2018/0358222 A1 12/2018 Venkatasubramanian et al.
2021/0151301 A1 5/2021 Niizeki et al.
2021/0159084 A1 5/2021 Tomura et al.
2022/0181147 A1 6/2022 Xue et al.
2022/0216037 A1 7/2022 Weimer et al.
2022/0282366 A1 9/2022 Weimer et al.
2023/0167545 A1 6/2023 Reddy et al.
2023/0357921 A1 11/2023 Weimer et al.
2023/0360922 A1 11/2023 Weimer et al.
2024/0136153 A1 4/2024 Weimer et al.
2024/0234091 A9 7/2024 Weimer et al.
2025/0308894 A1 10/2025 Lill et al.

FOREIGN PATENT DOCUMENTS

CN 1930670 A 3/2007
CN 1953146 A 4/2007
CN 102001616 A 4/2011
CN 102790127 A 11/2012
CN 103578937 A 2/2014
CN 104513973 A 4/2015
CN 104517815 A 4/2015
CN 106067440 A 11/2016
CN 109023311 A 12/2018
EP 1720072 A1 11/2006
EP 4022670 A1 7/2022
FR 2853313 A1 10/2004
JP S62019539 A 1/1987
JP H08152262 A 6/1996
JP 2000026194 A 1/2000
JP 2001148382 A 5/2001
JP 2002060944 A 2/2002
JP 2002212740 A 7/2002
JP 2004238649 A 8/2004
JP 2005187318 A 7/2005
JP 2005240061 A 9/2005
JP 2005354109 A 12/2005
JP 2007531987 A 11/2007
JP 2008141009 A 6/2008
JP 2008291344 A 12/2008
JP 2009226277 A 10/2009
JP 2011085670 A 4/2011
JP 2012233259 A 11/2012
JP 2013526061 A 6/2013
JP 2013526783 A 6/2013
JP 2013540359 A 10/2013
JP 2015070270 A 4/2015
JP 2015073096 A 4/2015
JP 2018507933 A 3/2018
JP 2018511166 A 4/2018
JP 2019096888 A 6/2019
JP 2019210522 A 12/2019
JP 2020098845 A 6/2020
JP 2020102628 A 7/2020
JP 2020523785 A 8/2020
KR 20030051692 A 6/2003
KR 20040023557 A 3/2004
KR 20060010932 A 2/2006
KR 20060053855 A 5/2006
KR 20070004009 A 1/2007
KR 20070015031 A 2/2007
KR 20070040596 A 4/2007
KR 100866735 B1 11/2008
KR 100986503 B1 10/2010
KR 20110065469 A 6/2011
KR 20130086525 A 8/2013
KR 20140068055 A 6/2014

(56) References Cited

FOREIGN PATENT DOCUMENTS

| | | | |
|---|---|---|---|
| KR | 20150037638 A | 4/2015 | |
| KR | 20150103642 A | 9/2015 | |
| KR | 20160129730 A | 11/2016 | |
| KR | 20200006628 A | 1/2020 | |
| KR | 20200140388 A | 12/2020 | |
| KR | 20220051009 A | 4/2022 | |
| SU | 382671 A | 10/1973 | |
| TW | 200723447 A | 6/2007 | |
| TW | 200937517 A | 9/2009 | |
| TW | 201133618 A | 10/2011 | |
| TW | 201204862 A | 2/2012 | |
| TW | 201528374 A | 7/2015 | |
| TW | I554634 B | 10/2016 | |
| TW | 202006175 A | 2/2020 | |
| WO | WO-2005048367 A1 | 5/2005 | |
| WO | WO-2011146212 A2 | 11/2011 | |
| WO | WO-2012050065 A1 | 4/2012 | |
| WO | WO-2013182299 A1 | 12/2013 | |
| WO | WO-2018213318 A1 | 11/2018 | |
| WO | WO-2019108376 A1 | 6/2019 | |
| WO | WO-2019209433 A1 | 10/2019 | |
| WO | WO-2020041213 A1 | 2/2020 | |
| WO | WO2020243342 * | 12/2020 | H01L 21/033 |
| WO | WO-2020243342 A1 | 12/2020 | |
| WO | WO-2021041916 A1 | 3/2021 | |

OTHER PUBLICATIONS

CN Office Action dated Feb. 20, 2025 in CN Application No. 202080039821 .X, with English Translation.

CN Office Action dated Jan. 9, 2024 in CN Application No. 202080039821 .X with English translation.

CN Office Action dated Jun. 29, 2025 in CN Application No. 202080061227.0, with English Translation.

CN Office Action dated Oct. 12, 2024 in CN Application No. 202080039821 .X with English translation.

International Preliminary Report on Patentability dated Apr. 13, 2023, in PCT Application No. PCT/US2021/052250.

International Search Report and Written Opinion dated Jan. 11, 2022, in Application No. PCT/US2021/052250.

International Search Report and Written Opinion dated Sep. 15, 2023 in PCT Application No. PCT/US2023/022327.

JP Office Action dated Apr. 8, 2025 in JP Application No. 2023-518084, with English Translation.

JP Office Action dated Jun. 24, 2025 in JP Application No. 2023519425, with English Translation.

KR Office Action dated Apr. 7, 2025 in KR Application No. 10-2022-7010538, with English Translation.

KR Office Action dated Dec. 15, 2023 in KR Application No. 10-2023-0138917, with English Translation.

KR Office Action dated Jul. 31, 2025 in KR Application No. 10-2022-7044415 with English translation.

KR Office Action dated May 27, 2025 in KR Application No. 10-2021-7042951, with English Translation.

KR Office Action dated Sep. 19, 2024 in KR Application No. 10-2022-7010538 with English Translation.

KR Office Action dated Sep. 27, 2024 in KR Application No. 10-2023-0138917 with English Translation.

Lee S., et al., "Bonding Structure and Etching Characteristics of Amorphous Carbon for a Hardmask Deposited by DC Sputtering," Carbon, 2019, vol. 154, pp. 277-284.

SG Search report and Written Opinion dated May 17, 2024 in SG Application No. 11202201891Q.

TW Office Action and Search Report dated Apr. 2, 2025 in TW Application No. 110135982, with English Translation.

TW Office Action and Search Report dated Feb. 18, 2025 in TW Application No. 110147200, with English Translation.

TW Office Action dated Mar. 24, 2025 in TW Application No. 110135532, with English Translation.

U.S. Final Office Action dated Feb. 6, 2025 in U.S. Appl. No. 17/753,208.

U.S. Final Office Action dated May 28, 2024 in U.S. Appl. No. 17/753,208.

U.S. Non-Final Office Action dated Jan. 30, 2024 in U.S. Appl. No. 17/753,208.

U.S. Non-Final Office Action dated Sep. 6, 2024 in U.S. Appl. No. 17/753,208.

U.S. Notice of Allowance, dated May 16, 2025, issued in U.S. Appl. No. 17/753,208.

U.S. Notice of Allowance dated Nov. 9, 2023, in U.S. Appl. No. 17/595,505.

U.S. Appl. No. 18/863,211, inventors Lillt, et al., filed on Nov. 5, 2024.

U.S. Restriction Requirement dated Aug. 7, 2025 in U.S. Appl. No. 18/247,060.

U.S. Restriction Requirement dated Jun. 2, 2025 in U.S. Appl. No. 17/905,955.

U.S. Restriction Requirement dated Mar. 26, 2025 in U.S. Appl. No. 18/245,950.

Callegari et al. (1993) "Optical properties of hydrogenated amorphous-carbon film for attenuated phase-shift mask applications," J.Vac. Sci. Technol. B 11(6):2697-2699.

Chinese First Office Action, dated Aug. 1, 2016, issued in Application No. CN 201410513782.9.

Chinese First Office Action, dated Aug. 16, 2016, issued in Application No. CN 201310049856.3.

Chinese First Office Action dated Nov. 22, 2019 issued in Application No. CN 201810585572.9.

Chinese First Office Action, dated Oct. 9, 2016, issued in Application No. CN 201410513389.X.

Chinese Second Office Action, dated Feb. 24, 2017, issued in Application No. CN 201310049856.3.

Chinese Second Office Action dated Mar. 28, 2017 issued in Application No. CN 201410513782.9.

Chinese Second Office Action dated Oct. 28, 2020 issued in Application No. CN 201810585572.9.

Chinese Third Office Action dated Mar. 22, 2021 issued in Application No. CN 201810585572.9.

Chinese Third Office Action dated Sep. 19, 2017 issued in Application No. CN 201410513782.9.

Decision to Grant a Patent dated Mar. 10, 2020 issued in JP 2014-193209.

EP Extended European Search Report dated Jul. 27, 2023, in Application No. EP20855963.3.

FABTECH news release: "New Product: Ashable hard mask process from Novellus targets high aspect ratio etch," (Jun. 28, 2007), 2 pages.

Grill, A. (1999) "Diamond-like carbon: state of the art," Diamond and Related Materials 8,pp. 428-434.

Grill, A. (1999) "Plasma-deposited diamondlike carbon and related materials," IBM Journal of Research and Development, vol. 43, ½, http://research.ibm.com/journal/rd/431/grill.html., 14 pp.

Grill, et al. (1990) "Diamondlike carbon films by rf plasma-assisted chemical vapor deposition from acetylene," IBM J. Res. Develop., 34(6):849-857.

Holmes et al. (1987) "Trimethylsilylacetylene", Organic Syntheses, Coll. vol. 8, p. 606; vol. 65, p. 61.

Ikeda et al. (1992) "Top-PECVD": A New Conformal Plasma Enhanced CVD Technology using TEOS, Ozone and Pulse-modulated RF Plasma, IEEE, pp. 11.2.1-11.2.4.

International Preliminary Report on Patentability dated Apr. 6, 2023 in Application No. PCT/US2021/051776.

International Preliminary Report on Patentability dated Dec. 9, 2021, for International Application No. PCT/US2020/034971.

International Preliminary Report on Patentability dated Jun. 29, 2023, in Application No. PCT/US2021/063109.

International Preliminary Report on Patentability dated Mar. 10, 2022, in Application No. PCT/US2020/048551.

International Preliminary Report on Patentability dated Sep. 22, 2022, in PCT Application No. PCT/US2021/022162.

International Search Report and Written Opinion dated Apr. 14, 2022, for International Application No. PCT/US2021/063109.

(56) References Cited

OTHER PUBLICATIONS

International Search Report and Written Opinion dated Dec. 4, 2020 issued in PCT/US2020/048551.
International Search Report and Written Opinion dated Jan. 10, 2022, in Application No. PCT/US2021/051776.
International Search Report and Written Opinion dated Jul. 7, 2021 in PCT Application No. PCT/US2021/022162.
International Search Report and Written Opinion dated Sep. 18, 2020 issued in PCT/US2020/034971.
Jacobsohn et al. (1998) "Hydrogenated Carbon-Nitrogen Films Obtained by PECVD Using Acetylyne and Nitrogen as Precursor Gases," Mat. Res. Soc. Symp. Proc., 498: 283-288.
Japanese First Office Action dated Jul. 6, 2018 issued in Application No. JP 2014-193560.
Japanese First Office Action dated Jun. 27, 2018 issued in JP 2014-193209.
Japanese First Office Action dated Mar. 24, 2020 issued in Application No. JP 2019-005610.
Japanese Second Office Action dated Mar. 15, 2021 issued in Application No. JP 2019-005610.
Japanese Second Office Action dated May 27, 2019 issued in JP 2014-193209.
Korean First Office Action dated Apr. 19, 2021 issued in KR 10-2014-0130456.
Korean First Office Action dated Apr. 20, 2021 issued in Application No. KR 10-2014-0130444.
Korean First Office Action, dated Aug. 27, 2019, issued in Application No. KR 10-2013-0015077.
Korean First Office Action dated Jul. 29, 2021 issued in KR 10-2021-0054382.
Korean First Office Action dated Jun. 28, 2020 issued in KR 10-2014-0022022.
Korean Office Action, dated Jun. 1, 2010, issued in Application No. KR 2009/0048358.
Korean Office Action, dated Sep. 15, 2015, issued in Application No. KR 10-2009- 0123999.
Korean Second Office Action dated Sep. 10, 2021 issued in KR 10-2014-0130456.
Korean Second Office Action dated Sep. 8, 2021 issued in Application No. KR 10-2014-0130444.
KR Office Action dated Dec. 9, 2022, in Application No. KR10-2022-0119327 with English translation.
KR Office Action dated Dec. 14, 2021, in Application No. KR1020140130456 with English translation.
KR Office Action dated Dec. 14, 2022 in Application No. KR10-2022-0049352 With English Translation.
KR Office Action dated Jan. 24, 2022, in Application No. KR1020210054382 with English translation.
KR Office Action dated Jul. 13, 2022 in Application No. KR10-2022-0031478 with English translation.
KR Office Action dated Jun. 21, 2022, in Application No. KR10-2014-0130444 with English translation.
Kragler et al. (1995) "Scanning tunneling microscopy based lithography employing amorphous hydrogenated carbon as a high resolution resist mask," Appl. Phys. Lett. 67(8):1163-1165.
Kreupl, Franz et al. (2008) "Carbon-Based Resistive Memory," presented at IEDM, submitted Jun. 26, 2008; accepted Aug. 4, 2008, 4 pages.
Lemaire, P.J., Walker, K.L., Kranz, K.S., Huff, R.G. and DiMarcello, F.V., (1990) "Diffusion of Hydrogen Through Hermetic Carbon Films on Silica Fibers," AT&T Bell Laboratories, 600 Mountain Avenue, Murray Hill, NJ 07974, Mat. Res. Soc. Symp. Proc. Vol 172, 12 pages, © 1990 Materials Research Society.
Matheson brochure: "PICO-TRAPTM AHM: Ultra-Purification System for PECVD of Amorphous Carbon Films," (Apr. 2010), Matheson, 2pp.
Muhl et al. (1999) "A Review of the Preparation of Carbon Nitride Films," Diamond and Related Materials, 8:1809-1830.
Ong, Soon-Eng et al. (2007) "Temperature effect on bonding structures of amorphous carbon containing more than 30at.% silicon," Diamond & Related Materials, 16:1823-1827.
Singapore Examination Report dated Jun. 22, 2016 issued in Application No. SG 201300974-1.
Singapore Search Report and Written Opinion dated Dec. 15, 2015 issued in Application No. SG 201300974-1.
Subramonium et al., "Low Temperature Ashable Hardmask (AHMTM) Films for sub-45nm Patterning," citation information unavailable, no date available, 3pp.
Taiwan Examination and Search Report, dated Oct. 4, 2016, issued in Application No. TW 102104640.
Taiwan Office Action, dated May 8, 2014, issued in Application No. TW 098142631.
Taiwanese First Office Action dated Apr. 9, 2018 issued in TW 103133764.
Taiwanese Notice of Allowance dated Apr. 26, 2017 issued in TW 103106336.
Tomasella E et al., "a-C:H thin films deposited by radio-frequency plasma: influence of gas composition on structure, optical properties and stress levels," Surface and Coatings Technology, Elsevier, NL, Jun. 18, 2001, vol. 141, pp. 286-296.
US Final Office Action, dated Apr. 12, 2011, issued in U.S. Appl. No. 11/849,208.
US Final Office Action dated Apr. 15, 2010 issued in U.S. Appl. No. 11/710,652.
US Final Office Action, dated Apr. 24, 2013, issued in U.S. Appl. No. 11/849,208.
US Final Office Action, dated Apr. 19, 2012, issued in U.S. Appl. No. 12/786,842.
US Final Office Action, dated Aug. 4, 2014, issued in U.S. Appl. No. 13/974,808.
US Final Office Action, dated Dec. 21, 2009, issued in U.S. Appl. No. 12/133,223.
US Final Office Action, dated Dec. 30, 2010, issued in U.S. Appl. No. 11/449,983.
US Final Office Action, dated Dec. 9, 2009, issued in U.S. Appl. No. 11/612,382.
US Final Office Action, dated Feb. 24, 2009, issued in U.S. Appl. No. 11/612,382.
US Final Office Action, dated Jul. 22, 2016, issued in U.S. Appl. No. 14/248,046.
US Final Office Action, dated Jul. 9, 2008, issued in U.S. Appl. No. 11/449,983.
US Final Office Action, dated Mar. 14, 2013, issued in U.S. Appl. No. 12/766,721.
US Final Office Action, dated May 12, 2009, issued in U.S. Appl. No. 11/612,382.
US Final Office Action, dated May 13, 2008, issued in U.S. Appl. No. 11/612,382.
US Final Office Action dated Oct. 18, 2012, issued in U.S. Appl. No. 12/163,670.
US Final Office Action, dated Oct. 24, 2007, issued in U.S. Appl. No. 11/263,148.
US Final Office Action, dated Oct. 9, 2015, issued in U.S. Appl. No. 14/270,001.
US Final Office Action, dated Sep. 14, 2012, issued in U.S. Appl. No. 11/849,208.
US Final Office Action, dated Sep. 15, 2009, issued in U.S. Appl. No. 11/449,983.
U.S. Non Final Office Action dated Mar. 16, 2023 in U.S. Appl. No. 17/595,505.
US Notice of Allowance and Allowed Claims dated Nov. 24, 2010 issued in U.S. Appl. No. 11/710,652.
US Notice of Allowance, dated Dec. 23, 2015, issued in U.S. Appl. No. 14/270,001.
US Notice of Allowance, dated Dec. 30, 2013, issued in U.S. Appl. No. 13/372,363.
US Notice of Allowance, dated Dec. 6, 2016, issued in U.S. Appl. No. 15/053,987.
US Notice of Allowance dated Jan. 3, 2013, issued in U.S. Appl. No. 12/163,670.

(56) References Cited

OTHER PUBLICATIONS

US Notice of Allowance, dated Jan. 7, 2008, issued in U.S. Appl. No. 11/318,269.
US Notice of Allowance, dated Jul. 1, 2013, issued in U.S. Appl. No. 13/371,184.
US Notice of Allowance, dated Jul. 20, 2012, issued in U.S. Appl. No. 12/786,842.
U.S. Notice of Allowance dated Jul. 20, 2023, in U.S. Appl. No. 17/595,505.
US Notice of Allowance, dated Jun. 28, 2013, issued in U.S. Appl. No. 12/766,721.
US Notice of Allowance, dated Mar. 16, 2011, issued in U.S. Appl. No. 11/449,983.
US Notice of Allowance, dated Mar. 18, 2008, issued in U.S. Appl. No. 11/263,148.
US Notice of Allowance, dated Mar. 2, 2010, issued in U.S. Appl. No. 12/133,223.
US Notice of Allowance, dated Mar. 22, 2011, issued in U.S. Appl. No. 11/710,377.
US Notice of Allowance, dated May 7, 2007, issued in U.S. Appl. No. 11/318,269.
US Notice of Allowance, dated Nov. 2, 2010, issued in U.S. Appl. No. 12/334,220.
US Notice of Allowance, dated Nov. 25, 2015, issued in U.S. Appl. No. 14/185,757.
US Notice of Allowance, dated Oct. 13, 2011, issued in U.S. Appl. No. 12/142,226.
US Notice of Allowance, dated Oct. 23, 2014, issued in U.S. Appl. No. 13/974,808.
US Notice of Allowance dated Oct. 25, 2013 issued in U.S. Appl. No. 13/032,392.
US Notice of Allowance, dated Oct. 31, 2016, issued in U.S. Appl. No. 14/248,046.
US Notice of Allowance, dated Oct. 4, 2006, issued in U.S. Appl. No. 11/318,269.
US Notice of Allowance, dated Oct. 7, 2011, issued in U.S. Appl. No. 12/048,967.
US Notice of Allowance dated Sep. 22, 2015, issued in U.S. Appl. No. 13/856,364.
US Office Action, dated Apr. 18, 2011, issued in U.S. Appl. No. 12/048,967.
US Office Action, dated Aug. 10, 2012, issued in U.S. Appl. No. 12/766,721.
US Office Action, dated Aug. 12, 2016, issued in U.S. Appl. No. 15/053,987.
US Office Action, dated Aug. 19, 2008, issued in U.S. Appl. No. 11/612,382.
US Office Action, dated Aug. 19, 2009, issued in U.S. Appl. No. 11/710,377.
US Office Action, dated Aug. 19, 2009, issued in U.S. Appl. No. 12/133,223.
US Office Action, dated Aug. 27, 2007, issued in U.S. Appl. No. 11/318,269.
US Office Action dated Aug. 5, 2010 issued in U.S. Appl. No. 11/710,652.
US Office Action, dated Aug. 6, 2015, issued in U.S. Appl. No. 14/185,757.
US Office Action, dated Dec. 14, 2006, issued in U.S. Appl. No. 11/318,269.
US Office Action dated, Dec. 27, 2007, issued in U.S. Appl. No. 11/449,983.
US Office Action, dated Feb. 14, 2012, issued in U.S. Appl. No. 12/163,670.
US Office Action, dated Feb. 15, 2013, issued in U.S. Appl. No. 13/371,184.
US Office Action, dated Feb. 28, 2014, issued in U.S. Appl. No. 13/974,808.
US Office Action, dated Jan. 14, 2016, issued in U.S. Appl. No. 14/248,046.
US Office Action, dated Jan. 5, 2009, issued in U.S. Appl. No. 11/449,983.
US Office Action, dated Jan. 5, 2009, issued in U.S. Appl. No. 11/710,377.
US Office Action, dated Jul. 6, 2012, issued in U.S. Appl. No. 12/163,670.
US Office Action dated Jul. 9, 2013 issued in U.S. Appl. No. 13/032,392.
US Office Action, dated Jun. 1, 2007, issued in U.S. Appl. No. 11/263,148.
US Office Action, dated Jun. 1, 2007, issued in U.S. Appl. No. 11/612,382.
US Office Action, dated Jun. 21, 2010, issued in U.S. Appl. No. 11/449,983.
US Office Action, dated Mar. 26, 2010, issued in U.S. Appl. No. 11/612,382.
US Office Action, dated Mar. 31, 2010, issued in U.S. Appl. No. 11/710,377.
US Office Action, dated May 15, 2015, issued in U.S. Appl. No. 14/270,001.
US Office Action, dated May 2, 2011, issued in U.S. Appl. No. 12/142,226.
US Office Action dated Nov. 20, 2009 issued in U.S. Appl. No. 11/710,652.
US Office Action, dated Nov. 22, 2010, issued in U.S. Appl. No. 12/048,967.
US Office Action, dated Nov. 9, 2011, issued in U.S. Appl. No. 12/786,842.
US Office Action, dated Oct. 19, 2011, issued in U.S. Appl. No. 12/163,670.
US Office Action, dated Oct. 9, 2007, issued in U.S. Appl. No. 11/612,382.
US Office Action, dated Oct. 9, 2013, issued in U.S. Appl. No. 13/372,363.
US Office Action, dated Sep. 3, 2010, issued in U.S. Appl. No. 11/849,208.
U.S. Appl. No. 17/905,955, inventors Reddy et al., filed on Sep. 9, 2022.
U.S. Appl. No. 18/245,950, inventors Weimer et al., filed on Mar. 20, 2023.
US Supplemental Notice of Allowance, dated Feb. 8, 2011, issued in U.S. Appl. No. 12/334,220.
Van de Ven et al. (1990) "Advantages of Dual Frequency PECVD for Deposition of ILD and Passivation Films," VLSI Multilevel Interconnection Conference Proceedings, Seventh International IEEE, 194-201.
Voronkin et al. (1994) "Structure and mechanical properties of a-C:H films deposited onto polymer substrates: Diamond and Related Materials," 4:5-9.
JP Office Action dated Aug. 26, 2025 in JP Application No. 2023-518084, with English Translation.
U.S. Non-Final Office Action dated Nov. 17, 2025 in U.S. Appl. No. 18/247,060.
U.S. Non-Final Office Action dated Sep. 8, 2025 in U.S. Appl. No. 18/245,950.
JP Office Action dated Dec. 9, 2025 in JP Application No. 2023-535636, with English Translation.
KR Office Action dated Dec. 12, 2025 in KR Application No. 10-2021-7042951, with English Translation.
U.S. Final Office Action dated Jan. 5, 2026 in U.S. Appl. No. 18/245,950.
U.S. Non-Final Office Action dated Feb. 18, 2026 in U.S. Appl. No. 18/493,614.
JP Office Action dated Jul. 7, 2025 in JP Application No. 2023-535636, with English Translation.
KR Office Action dated Jun. 8, 2026 in KR Application No. 10-2022-7045894, with English Translation.

* cited by examiner

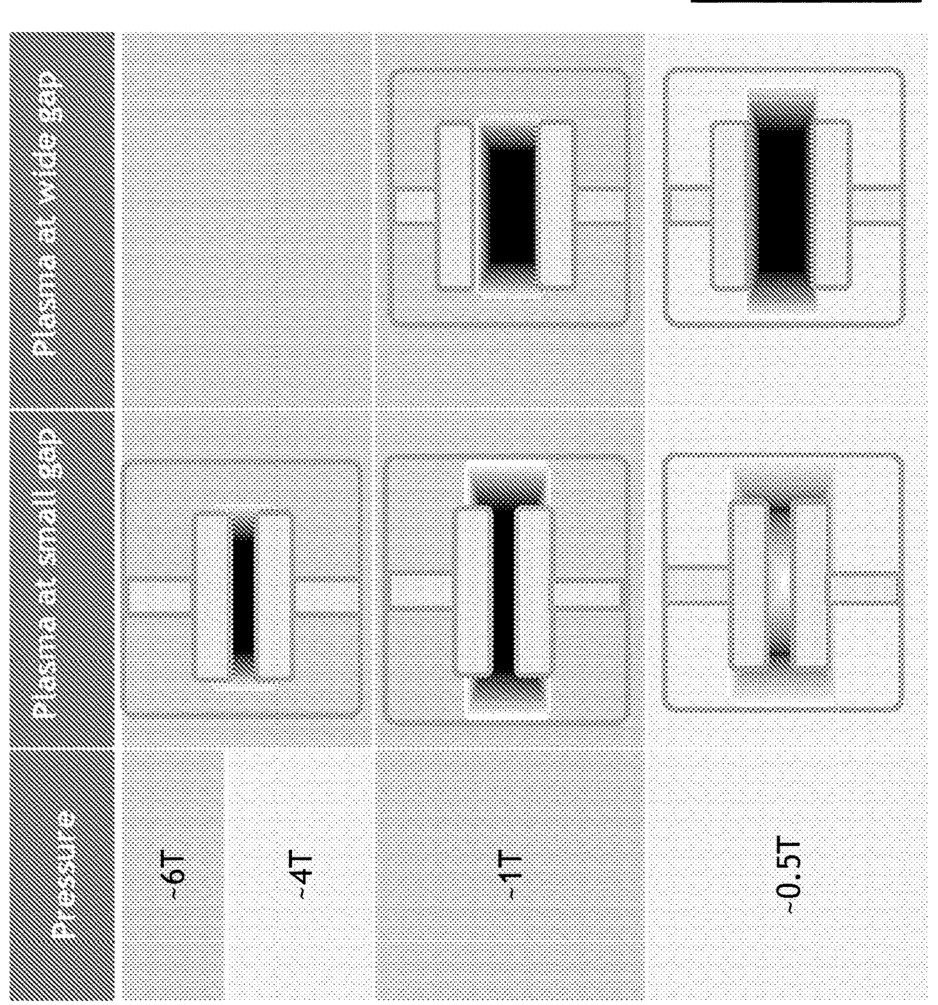
FIG. 2A
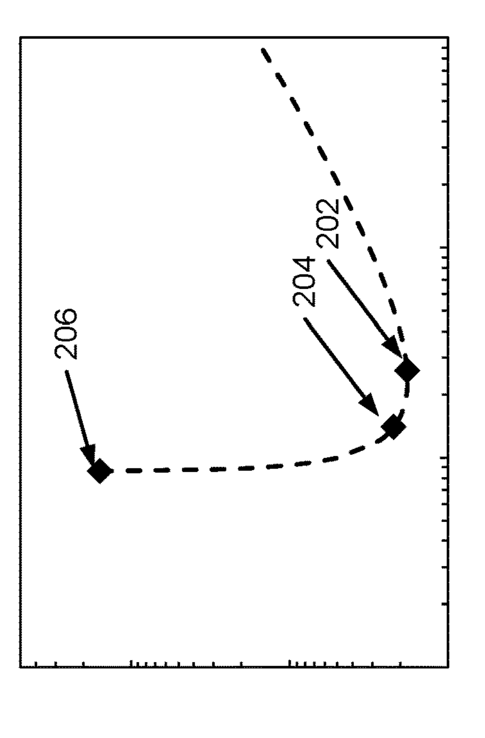
FIG. 2B
| | P (torr) | Gap (inch) | D (cm) | PD | BD Voltage |
|---|---|---|---|---|---|
| SHD-Ped | 0.5 | 0.65 | 1.651 | 0.8255 | 15747 |
| SHD-Ped | 0.5 | 1.15 | 2.921 | 1.4605 | 219 |
| PED-CHM | 0.5 | 2 | 5.08 | 2.54 | 180 |
FIG. 2C

HIGH SELECTIVITY, LOW STRESS, AND LOW HYDROGEN CARBON HARDMASKS IN LOW-PRESSURE CONDITIONS WITH WIDE GAP ELECTRODE SPACING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Amorphous carbon films may be used as hard masks and etch stop layers in semiconductor processing, including in memory and logic device fabrication. These films are also known as ashable hard masks (AHMs) because they may be removed by an ashing technique. As aspect ratios in lithography increase, AHMs require higher etch selectivity. Current methods of forming highly selective AHMs using plasma enhanced chemical vapor deposition (PECVD) processes result in AHMs with high stress, low modulus, and/or low etch selectivity, limiting the AHMs' usefulness as hard masks. Accordingly, it is desirable to produce AHMs having high etch selectivity, but low stress.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

In one aspect, a method of forming an ashable hard mask (AHM) film is provided, where the method includes exposing a semiconductor substrate to a process gas at a pressure of about 1 Torr or less, the process gas comprising a hydrocarbon precursor gas and depositing on the substrate an AHM film by a plasma enhanced chemical vapor deposition (PECVD) process, where the PECVD process includes igniting a plasma between a showerhead and a pedestal and where the showerhead and the pedestal are separated by a gap of about 0.70 inches or more.

In another aspect, the hydrocarbon precursor gas includes compounds having a molecular weight of at most about 50 g/mol. In another aspect, the hydrocarbon precursor gas includes compounds having a C:H ratio of at least about 0.5. In another aspect, the hydrocarbon precursor gas includes acetylene ($C_2H_2$). In another aspect, the hydrocarbon precursor has a partial pressure between about 1% and about 5% of the pressure of the process gas. In another aspect, the method is performed in a multi-station reactor. In another aspect, the method is performed in a single-station reactor. In another aspect, the internal stress of the AHM film is at most about −1400 MPa. In another aspect, the modulus of the AHM film is at least about 80 GPa. In another aspect, the density of the AHM film is at least about 1.5 g/cm 3. In another aspect, the method also includes patterning the deposited AHM film and etching the patterned AHM film to define features of the AHM film in the substrate. In another aspect, the method also includes etching layers in the substrate underlying the AHM film.

In another aspect, a plasma enhanced chemical vapor deposition (PECVD) reactor is provided that includes a pedestal configured to hold a wafer, a showerhead configured to distribute process gas into a gap between the pedestal and the showerhead, the gap being adjacent to the wafer, and a pedestal lift mechanism configured to translate the pedestal relative to the showerhead into at least first and second positions, where, in the first position, the pedestal is spaced apart from the showerhead by no more than about 0.70 inches and where, in the second position, the pedestal is spaced apart from the showerhead by no less than about 1.45 inches.

In another aspect, the pedestal comprises a includes of lift pin holes and the PECVD reactor also includes a plurality of lift pins configured to pass at least partially through the lift pin holes of the pedestal and lift the wafer from an upper surface of the pedestal and a pin lift mechanism mechanically coupled to the lift pins and configured to raise and lower the lift pins. In another aspect, the PECVD reactor also includes chamber walls that at least partially enclose the showerhead and pedestal, where the pedestal is spaced apart from the showerhead by a first distance, where the pedestal is spaced apart from the chamber walls by a second distance, and where the first distance is at least 55% the size of the second distance.

These and other features will be described in more detail below with reference to the figures.

BRIEF DESCRIPTION OF DRAWINGS

FIG. 2A is an illustration of plasmas in a semiconductor process chamber at varying pressures and electrode spacings according to various embodiments.

FIG. 2B is a graph of breakdown voltage as a function of the product of pressure and distance.

FIG. 2C is a chart of breakdown voltages according to various embodiments.

DETAILED DESCRIPTION

Introduction and Context

In semiconductor processing, masking methods are used to pattern and etch substrates. As substrate aspect ratios increase, the demand for highly selective hard masks increases. Masks that have high etch selectivity and yet are easy to remove without damage to the substrate are important to processing substrates. Ashable hard masks (AHMs) can be used as masks in etch stop layers or during selective etching, or where a photoresist may not be thick enough to mask the underlying layer. AHMs may also be used on glass substrates used for displays and other technologies.

AHM films have a chemical composition that allows them to be removed by a technique referred to as "ashing," "plasma ashing," or "dry stripping" once they have served their purpose. One example of an AHM film is an amorphous carbon layer or film. An AHM film is generally composed of carbon and hydrogen with, optionally, a trace amount of one or more dopants (e.g., nitrogen, fluorine, boron, and silicon). The bonding structure of an AHM can vary from $sp^2$ (graphite-like) or sp a (diamond-like), or a combination of both, depending on the deposition conditions.

Figure 1:
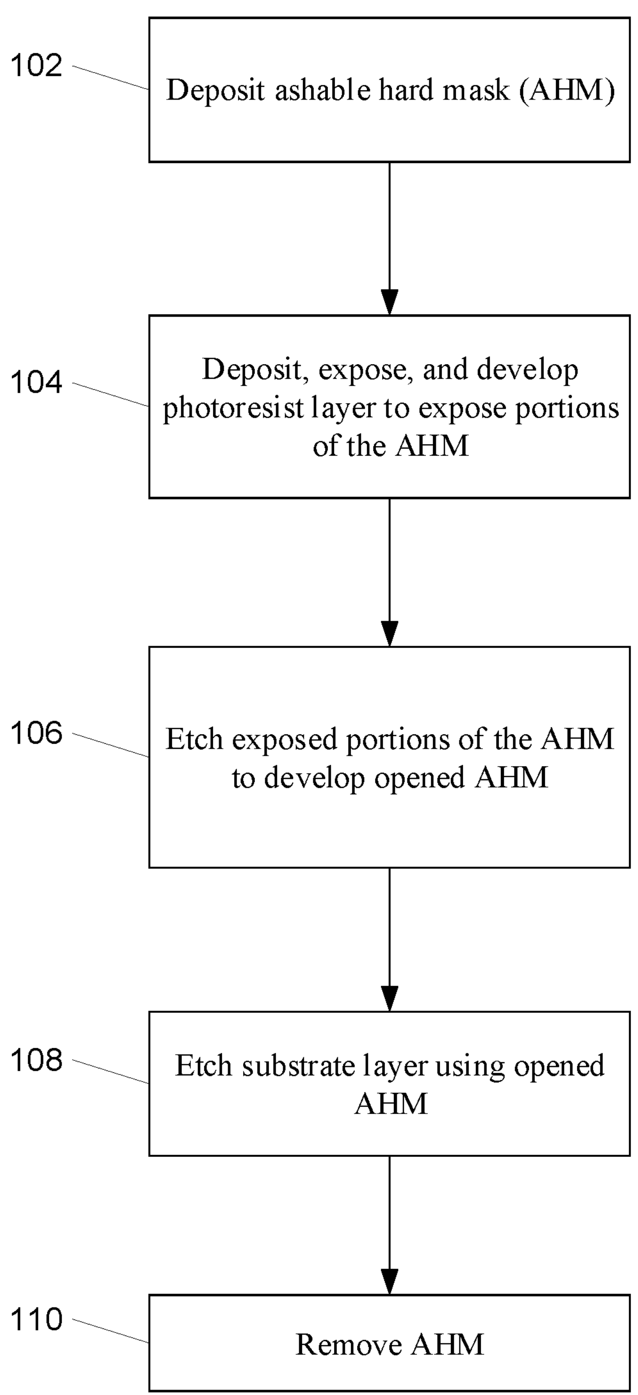
FIG. 1 is a process flow diagram showing relevant operations of methods of using ashable hard masks in etching operations according to various embodiments.

FIG. 1 is a process flow diagram showing relevant operations of methods of using an AHM as a hard mask in etching operations. While the description below refers chiefly to semiconductor substrates, the methods may also be applied to layers on other types of substrates including glass substrates. Examples of materials that may be masked with the AHM include dielectric materials such as oxides (e.g., $SiO_2$) and nitrides (e.g., SiN and TiN), polysilicon (Poly-Si), and metals such as aluminum (Al), copper (Cu), and tungsten (W). In certain embodiments, the AHMs described herein are used to pattern oxides, nitrides, or polysilicon layers.

In operation 102, an ashable hard mask is deposited on the layer to be etched by plasma enhanced chemical vapor deposition (PECVD). PECVD processes involve generating plasma in the deposition chamber. As described further below with reference to FIGS. 4 and 5, the plasma may be generated in a relatively low-pressure environment and with a wide gap spacing that maintains plasma confinement and reduces or eliminates parasitic plasmas. In some processes, one or more AHM layers are deposited.

In operation 104, a photoresist layer is deposited, exposed, and developed in accordance with the desired etch pattern. In some implementations, an anti-reflective layer (ARL) may be deposited on the AHM film prior to photoresist deposition.

In operation 106, the AHM film is opened by etching the exposed portions of the AHM. Opening the AHM may be performed by a fluorine-rich dry etch and/or by an oxygen-rich dry etch.

Next, in operation 108, the substrate layer is selectively etched to transfer the pattern to the substrate layer. The selective etch may be performed such that the substrate layer is etched without substantially diminishing the AHM walls. Examples of etches can include radical and/or ionic-based etches. Examples of etch chemistries can include halogen-based etch chemistries such as fluorine-containing and chlorine-containing etch chemistries. For example, capacitively-coupled plasmas generated from fluorocarbon-containing process gases may be used to selectively etch oxide layers. Specific examples of process gases include CxFy-containing process gases, optionally with oxygen ($O_2$) and an inert gas, such as $C_4H_8/CH_2F_2/O_2/Ar$.

Lastly, in operation 110, a technique referred to as ashing, plasma ashing, or dry stripping is used to remove the AHM. Ashing may be performed by an oxygen-rich dry etch. Often, oxygen is introduced in a chamber under vacuum and RF power creates oxygen radicals in plasma to react with the AHM and oxidize it to water ($H_2O$), carbon monoxide (CO), and carbon dioxide ($CO_2$). Optionally, any remaining AHM residue may also be removed by wet or dry etching processes after ashing. The result is a patterned substrate layer.

High aspect ratio patterning uses AHMs having high etch selectivity. Etch selectivity can be determined by comparing the etch rate of the AHM layer to an underlying layer. The etch selectivity can sometimes be approximated by determining the hydrogen content, refractive index (RI), extinction coefficient (k), density, and modulus, or rigidity, of the AHM layer. Typically, lower hydrogen content, higher RI, higher k, higher density, and higher modulus, or a more rigid, AHM is able to withstand higher etch rates in an etch process involving more ion bombardment. Therefore, AHMs with lower hydrogen content, higher RI, higher k, higher density, and/or higher modulus have higher selectivity and lower etching rate and can be used more efficiently and effectively for processing high aspect ratio semiconductor processes. The desired etch selectivity of the AHM may depend on the etching process and the composition of the underlying layers, but the correlation between etch selectivity and the material properties above remains the same regardless of the etching process or composition of the underlying layers. The selectivity correlations as described here applies to all types of underlying layers, including polysilicon layers, oxide layers, and nitride layers.

It has been observed that AHM films produced using continuous wave (CW) LF and HF plasma and at relatively higher pressures (e.g., at or above approximately 4 Torr) may have certain problems. For example, they may have relatively high internal stress, high hydrogen content, low density, and/or low hardness/modulus.

Highly selective AHM films typically have high stress levels. Some methods to form AHMs use continuous wave RF power plasma in a PECVD process. Using continuous wave RF power results in continuous ion bombardment, which increases film density, thereby increasing etch selectivity by creating more $sp^3$ bonds between carbon atoms. However, continuous ion bombardment may also incorporate excessive unbound hydrogen atoms in the film and modify the growing film by bombardment with heavy atomic weight ions. These effects may increase the stress of the deposited AHM film, which limits AHM applications because high stress AHMs are more likely to exhibit line-bending.

On the other hand, AHMs with low stress levels, and concomitant less line bending, typically have lower selectivity. Some methods to form AHMs pulse RF power plasma during a PECVD process are provided. Pulsing the RF power results in pulsed ion bombardment, which decreases stress levels, thereby reducing line-bending. However, pulsed ion bombardment may also reduce the number of $sp^3$ bonds, which leads to lower density and lower selectivity. The lower selectivity requires a thicker AHM for the same etch process, which increases the amount of line-bending.

It is generally believed that the quality of AHMs (where higher quality includes a higher selectivity, higher modulus, lower hydrogen content, and/or lower stress) can be improved by bombardment with more energetic ions. One technique for increasing the energy of the ions of the plasma is to deposit the AHMs in a lower pressure PECVD process. It is believed that, in a lower pressure environment, ions of the plasma travel a longer mean free path (i.e., average distance traveled between successive collisions with other ions) and thus can be accelerated by the electrodes over a longer distance, resulting bombardment with more energetic ions. However, typical process chambers have electrodes spaced relatively close together. As a result, there may be excessive and undesirable parasitic plasmas when depositing AHMs at lower than typical pressures. Parasitic plasmas refer to plasmas that are not in the desired locations and which therefore reduce the effectiveness of the PECVD process (e.g., resulting in non-uniform depositions on a wafer surface, robbing the desired plasmas of power, and/or resulting in undesirable levels of deposition on process chamber surfaces).

FIG. 2A illustrates the formation of plasmas at various PECVD operating pressures and at small gap electrode spacings (e.g., small gaps of approximately 0.65") and at wide gap electrode spacings (e.g., large gaps of approximately 1.0") according to various embodiments. As shown in FIG. 2A, the plasma is mostly or entirely contained between small gap electrodes, when operating at relatively high pressures (e.g., approximately 4 Torr and approximately 6 Torr). In contrast, when the operating pressures is lowered to approximately 1 Torr, there is a significant amount of parasitic plasma that extends out from between the small gap electrodes. Similarly, when the operating pressure is lowered to approximately 0.5 Torr, an even greater fraction of the plasma forms parasitic plasma located outside of the electrode gap. However, at wider gaps (e.g., approximately 1.0") as contemplated in various embodiments, the plasma remains substantially confined between the wide gap electrodes at the low pressures of approximately 1.0 Torr and even 0.5 Torr.

FIG. 2B illustrates a Paschen curve for an example process gas used in various embodiments. As shown in FIG. 2B, the breakdown voltage significantly increases as the product of pressure and distance falls below approximately 1.5 (torr-cm). In general, plasma will generally form along the path having the lowest breakdown voltage. Thus, it is generally desirable for the breakdown voltage between the showerhead and pedestal to be lower than, or at least not significantly greater than, the breakdown voltage between the pedestal (or showerhead) and the chamber walls (in order to reduce or eliminate parasitic plasmas). Data point 202 illustrates the breakdown voltage for a gap of 2" at 0.5 Torr and may correspond to a gap between a pedestal (or showerhead) and the chamber walls. Data point 204 illustrates the breakdown voltage for a gap of 1.15" at 0.5 Torr and may correspond to a gap between a pedestal and a showerhead. Data point 206 illustrates the breakdown voltage for a gap of 0.65" at 0.5 Torr and may correspond to a gap between a pedestal and a showerhead. These values are also charted in FIG. 2C.

As shown in FIGS. 2B and 2C and at a PEVCD operating pressure of 0.5 Torr, the breakdown voltage at relatively small showerhead-pedestal gaps of 0.65" is orders of magnitude greater than the breakdown voltage between the pedestal (or showerhead) and chamber walls (e.g., a 2" gap). In such an arrangement, the majority of the plasma generated will be parasitic plasma that is between the pedestal (or showerhead) and chamber walls, rather than the desired location between the pedestal and showerhead.

In contrast, the breakdown voltage at relatively larger showerhead-pedestal gaps of approximately 1.15" is within about 20% or 25% of the breakdown voltage between the pedestal (or showerhead) and chamber walls (e.g., a 2" gap). Such an arrangement significantly reduces the formation of parasitic plasmas, as the breakdown voltage does not severely favor parasitic plasmas as it did in the example with a showerhead-pedestal gap of approximately 0.65".

Figures 3A, 3B, 3C:
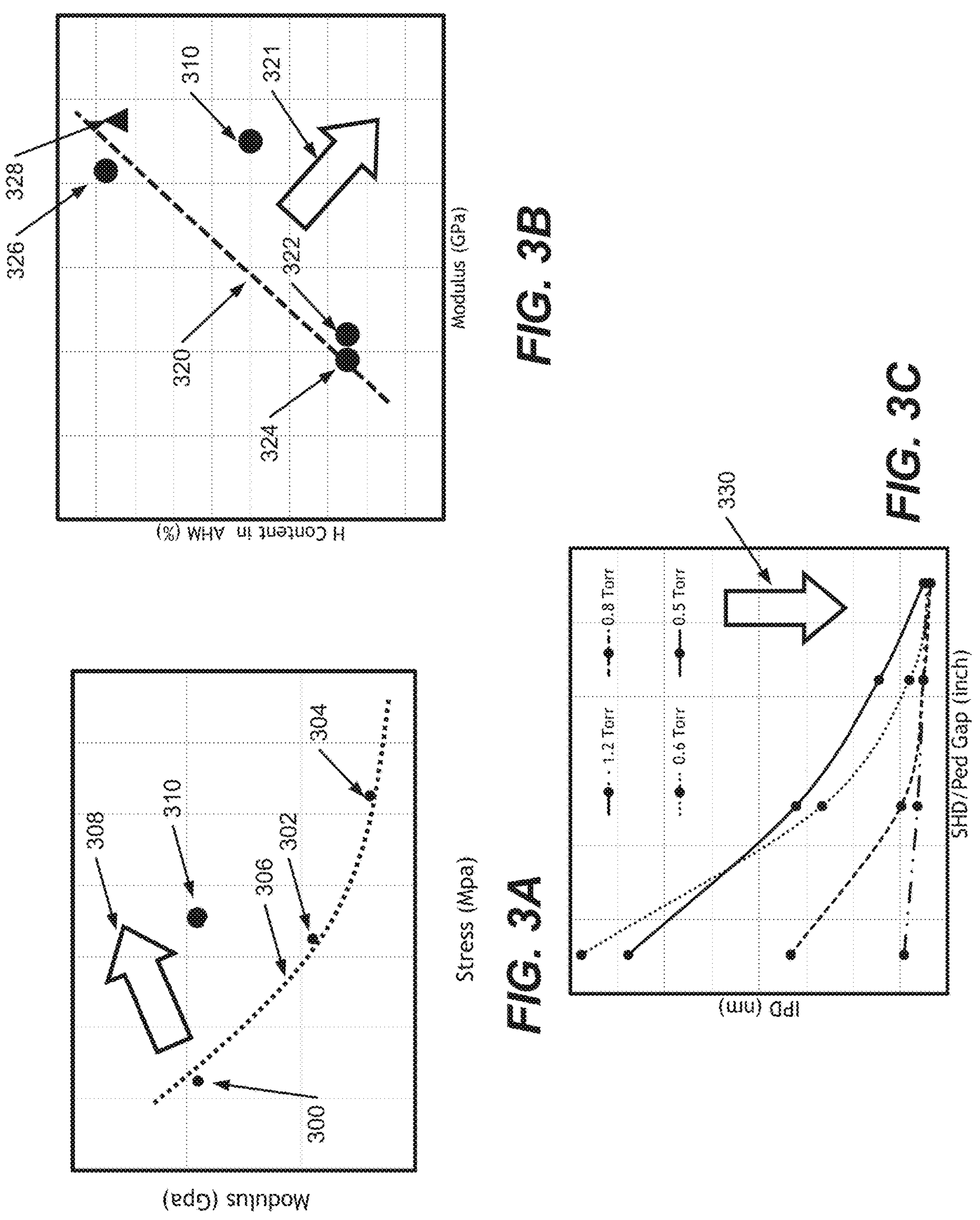
FIG. 3A is a graph of modulus versus stress according to various embodiments.
FIG. 3B is a graph of hydrogen content in an ashable hard mask as a function of modulus according to various embodiments.
FIG. 3C is a graph of in-plane displacement for various pressures and electrode spacings according to various embodiments.

FIG. 3A graphs the modulus and stress of ashable hard masks (AHMs) 300, 302, and 304 deposited using a processing chamber with a small electrode gap (e.g., approximately 0.65") and the modulus and stress of an AHM 310 deposited using a processing chamber with a large electrode gap (e.g., approximately 1.15"). In general, the AHMs deposited with a small electrode gap have a modulus and stress level that lies along curve 306. In other words, increasing the modulus generally results in increasing the level of stress. As discussed above, it is generally desirable to have a high modulus, but a low level of stress. Thus, it would be desirable to form AHMs that break the trendline of curve 306 (in direction 308) to obtain a higher modulus and/or lower stress level. As shown in FIG. 3A, the AHM 310, which may be deposited using a processing chamber with a large electrode gap (e.g., approximately 1.15"), is able to break the trendline of curve 306 in direction 308 and thus achieve a higher modulus and/or lower stress level than AHMs formed with small electrode gaps (e.g., approximately 0.65").

FIG. 3B graphs the hydrogen content and modulus of ashable hard masks (AHMs) 322, 324, 326, and 328 deposited using a processing chamber with a small electrode gap (e.g., approximately 0.65") and the modulus and stress of an AHM 310 deposited using a processing chamber with a large electrode gap (e.g., approximately 1.15"). In general, the AHMs deposited with a small electrode gap have a hydrogen fraction and stress level that lies along curve 320. In other words, increasing the modulus generally results in increasing the level of hydrogen. As discussed above, it is generally desirable to have a high modulus, but a low level of hydrogen. Thus, it would be desirable to form AHMs that break the trendline of curve 320 (in direction 321) to obtain a higher modulus and/or a lower fraction of hydrogen. As shown in FIG. 3B, the AHM 310, which may be deposited using a processing chamber with a large electrode gap (e.g., approximately 1.15"), is able to break the trendline of curve 320 in direction 321 and thus achieve a higher modulus and/or hydrogen content than AHMs formed with small electrode gaps (e.g., approximately 0.65").

FIG. 3C graphs the in-plane displacement and showerhead-pedestal gap of ashable hard masks (AHMs) deposited at 0.5 Torr, 0.6 Torr, 0.8 Torr, and 1.2 Torr. In general, it is desirable to reduce or eliminate in-plane displacement (as indicated by arrow 330). As shown in FIG. 3C, AHMs deposited at lower pressures and larger showerhead-pedestal gap have lower levels of in-plane displacement.

Forming Ashable Hard Masks

According to various embodiments, methods of forming AHM films are provided that produce films that have high selectivity and low stress. An AHM film deposition technique may, if desired, use low frequency (LF) RF pulsing, with or without continuous wave (CW) high frequency (HF) RF, at high single station LF power to reduce the internal stress (make the stress more neutral), reduce the hydrogen content, and increase the selectivity of the AHMs. These methods yield AHMs with improved selectivity at a given stress level, or a decreased stress level at a given selectivity, thus improving the AHM performance in semiconductor processing.

High LF power may be used at each station. In various embodiments, the general range of the process is 3500 to 6500 W of LF power per station with a significant stress reduction and densification of the film. A carrier gas that contains substantially only helium may be used, in some embodiments. Fast pulsing frequency and low duty cycle, resulting in a short LF "on time" may allow the plasma to increase the peak ion energy while maintaining a low mean ion density. In other words, because of the fast LF pulsing, there are fewer ions with higher energy than continuous wave plasma.

Certain embodiments use relatively fast (greater than 100 Hz at 25% duty cycle) LF pulsing, with or without CW HF, at high LF power per station.

Figure 4:
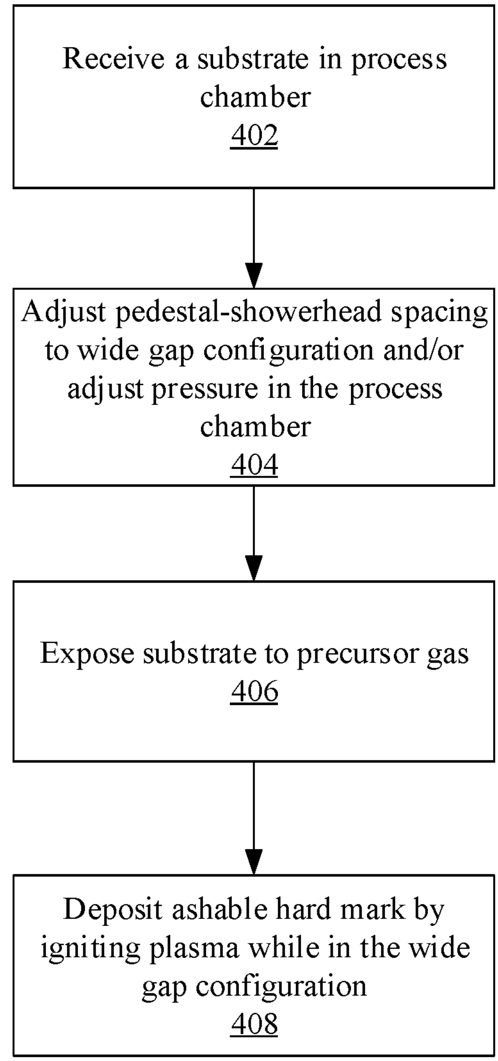
FIG. 4 is a process flow diagram showing relevant operations of methods of forming ashable hard masks in low-pressure conditions with wide gap electrode spacing according to various embodiments.

FIG. 4 shows a process flow diagram showing relevant operations of methods of forming AHMs in a process chamber having a relatively wide gap (e.g., approximately 1.15") between the electrodes, according to various embodiments.

In operation 402, a substrate is received in a process chamber. The substrate may be provided to the chamber in this operation, or the substrate may already be in the chamber from a prior operation.

In operation 404, the process chamber may be configured with a wide electrode gap and/or may be configured with a desired operating pressure (e.g., a vacuum pump may be used to—before, during, and/or after the introduction of process gases—create a vacuum of desired strength within the processing chamber). Operation 404 may be omitted if the process chamber is already configured with a wide electrode gap (or has a fixed electrode spacing) and is already at the desired operating pressure.

In operation 406 the substrate is exposed to a process gas including a hydrocarbon precursor. In addition to hydrocarbon precursors, an inert gas carrier may be used. The inert gas may include helium (He), argon (Ar), nitrogen ($N_2$), hydrogen ($H_2$), or a combination of any of these. In some embodiments the inert gas is substantially entirely helium. As non-limiting examples, operation 406 may involve exposing the substrate to process gases at an operating pressure of about 1.5 Torr, between about 1.5 and about 1.25 Torr, about 1.25 Torr, between about 1.25 and about 1.0 Torr, about 1.0 Torr, between about 1.0 and about 0.75 Torr, about 0.75 Torr, between about 0.75 Torr and about 0.5 Torr, about 0.5 Torr, between about 0.5 Torr and about 0.25 Torr, about 0.25 Torr, or less than about 0.25 Torr.

Next, in operation 408, an ashable hard mask is deposited on the substrate by a PECVD process by igniting plasma. As non-limiting examples, operation 408 may involve igniting plasma between electrodes (e.g., a showerhead and pedestal) with a spacing of at least about 0.65" (inches), at least about 0.70", between about 0.65" and about 0.75", about 0.75", between about 0.75" and 0.85", about 0.85", between about 0.85" and about 0.95", about 0.95", between about 0.95" and about 1.05", about 1.05", between about 1.05" and about 1.15", about 1.15", between about 1.15" and about 1.25", about 1.25", between about 1.25" and about 1.35", about 1.35", between about 1.35" and about 1.45", about 1.45", between about 1.45" and about 1.55", about 1.55", or more than about 1.55". Depositing an AHM may involve any combination of the aforementioned examples of electrode spacings and operating pressures.

In some embodiments, the process chamber may be configured with a certain ratio between the showerhead-pedestal distance (i.e., gap) and the pedestal-chamber distance (e.g., an average, minimum, and/or maximum pedestal-chamber gap). As a particular example, creating the AHMs of the present disclosure may involve configuring a process chamber to have a ratio between the showerhead-pedestal distance and the pedestal-chamber distance that is greater than 50% (i.e., when the distance between the pedestal and chamber walls is no more than twice the distance between the pedestal and showerhead). As additional examples, the process chamber may be configured to have a ratio between the showerhead-pedestal distance and the pedestal-chamber distance that is greater than about 55%, greater than about 57%, or greater than about 60%. In one example, the process chamber may be configured to have a ratio between the showerhead-pedestal distance and the pedestal-chamber distance that is about 57.5%.

In some embodiments, a dual RF plasma source may be used to produce a plasma having a pulsed low frequency (LF) component and a high frequency (HF) component. The pulsed LF component may be produced by pulsing a LF power source. In some embodiments, pulsing the LF RF power includes using a high power, fast pulse, and low duty cycle to generate a high peak energy ion bombardment with a low mean ion density.

The result of operation 408 is an AHM film. By utilizing a relatively low operating pressure (e.g., 0.5 Torr) and wide electrode spacing (e.g., 1.15"), this process produces a film with better modulus to stress ratio and higher selectivity (and lower hydrogen).

In some embodiments and depending on the duty cycle of the LF power, the pulsing frequency may be adjusted to maintain the high mean ion energy, while altering the mean ion density. In some embodiments the DC may be decreased to produce a low modulus, low stress, film. In other embodiments, DC may be increased to produce a high modulus, high stress, film. Increasing DC may also increase the deposition rate of the AHM film. Both types of films may be desirable depending on other process conditions.

Pedestal-Showerhead Gap

Figure 5:
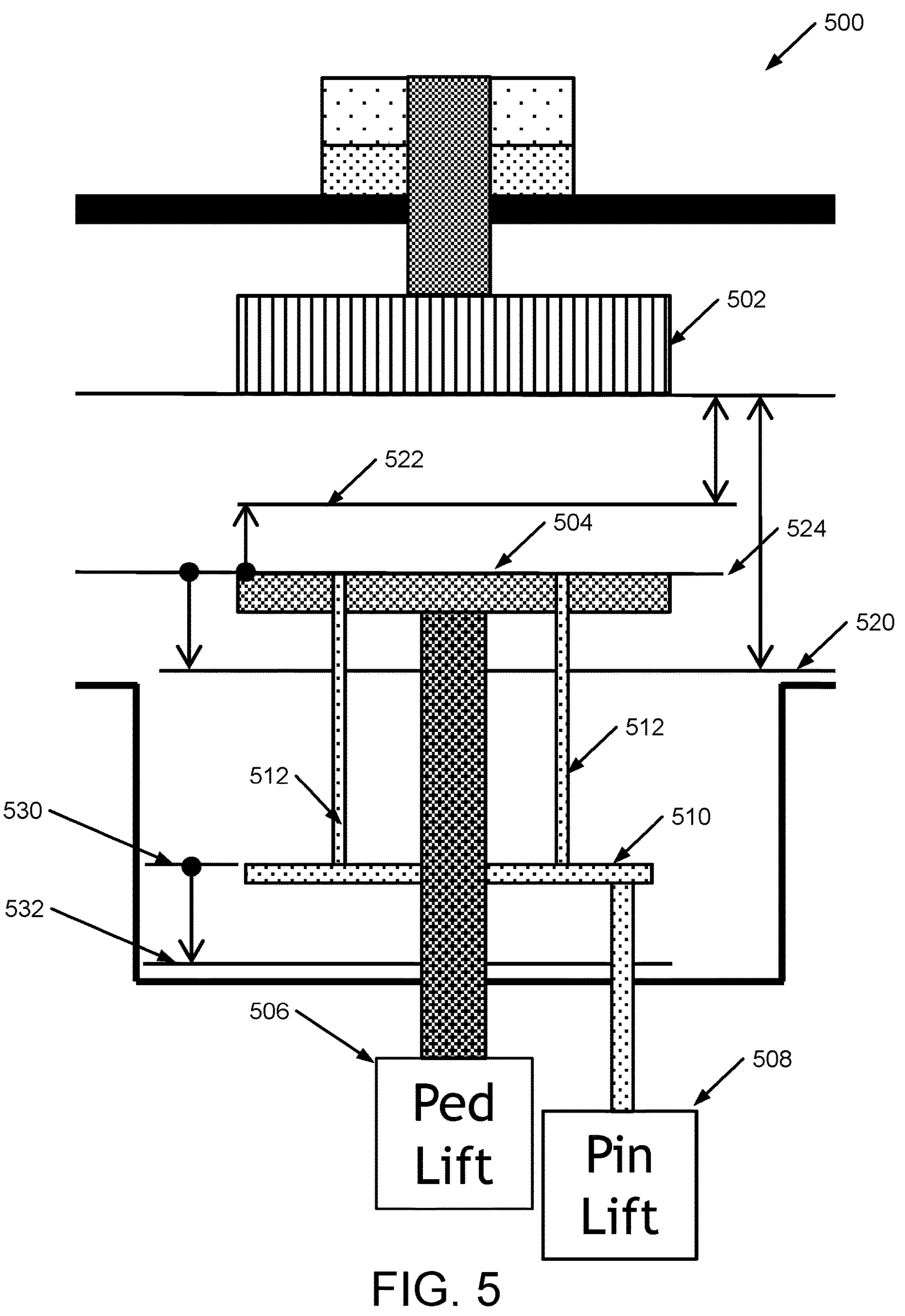
FIG. 5 shows a schematic illustration of a plasma enhanced chemical vapor deposition (PECVD) chamber configurable with wide gap electrode spacing according to various embodiments.

FIG. 5 is a schematic illustration of a plasma enhanced chemical vapor deposition (PECVD) chamber 500 configurable with wide gap electrode spacing according to various embodiments. As shown in FIG. 5, chamber 500 may include a showerhead 502 and a pedestal 504. Chamber 500 may also include a pedestal lift mechanism 506 and a pin lift mechanism 508.

Pedestal lift mechanism 506 may be configured to raise or lower pedestal 504 (towards or away from showerhead 502) during various operations. As an example, pedestal lift mechanism 506 may be configured to lower pedestal 504 to position 520 in order to facilitate loading and unloading of wafers from chamber 500. By lowering pedestal 504 to position 520, there may be additional room for wafer handling devices to reach into the process chamber 500 without impacting components within the chamber.

Pin lift mechanism 508 may be configured to lift a wafer off of the surface of pedestal 504, when desired. Pin lift mechanism 508 may, in some embodiments, be configured to lift a platen 510 or other structure that is in turn mechanically coupled to a plurality of lift pins 512. Lift pins 512 may extend through holes in pedestal 504 such that when pin lift mechanism 508 is properly actuated, the lift pins 512 lift any wafer present off of the surface of pedestal 504. At times when it is desired for lift pins 512 to remain flush with or below the surface of pedestal 504, pin lift mechanism may be controlled based on the position of pedestal lift 506 (e.g., to ensure that lowering the pedestal lift 506 does not inadvertently result in lift pins 512 extending above the surface of pedestal 504). In some embodiments, pin lift 508 may have a range of motion of about 0.5" (e.g., upper position 530 and lower position 532 may be separated by about 0.5").

Pedestal lift 506 may be configured to raise or lower the pedestal relative to the showerhead 502 to positions 520 and 522 and all positions therebetween. In some embodiments, when pedestal 504 is in position 522 (e.g., the position with the smallest gap), the pedestal 504 may be 0.65 inches from showerhead 502. In such embodiments, when pedestal 504 is in position 520 (e.g., the position with the largest gap), the pedestal 504 may be 1.50 inches from showerhead 502. Position 524 may correspond to a gap of about 1.0" between showerhead 502 and pedestal 504. As discussed herein, larger gaps than the gap associated with position 520 and smaller gaps than the gap associated with position 522 are also possible. The example gap sizes discussed herein should be understood as at least describing different embodiments of the arrangement of FIG. 5.

While the preceding examples describe moving the pedestal 504 relative to the showerhead 502, it should be appreciated that the present disclosure also encompasses embodiments in which the showerhead 502 is moved while the pedestal 504 remains in place and also encompasses embodiments in which both the showerhead 502 and pedestal 504 are movable relative to each-other.

Process Window

This section describes various process parameters that may be employed to produce AHM films. The process parameters are provided for a plasma enhanced chemical vapor deposition process that takes place in a process chamber such as one described below.

In various embodiments, the total pressure in the process chamber is about 1.5 Torr, between about 1.5 and about 1.25 Torr, about 1.25 Torr, between about 1.25 and about 1.0 Torr, about 1.0 Torr, between about 1.0 and about 0.75 Torr, about 0.75 Torr, between about 0.75 Torr and about 0.5 Torr, about 0.5 Torr, between about 0.5 Torr and about 0.25 Torr, about 0.25 Torr, or less than about 0.25 Torr. In some embodiments, the hydrocarbon precursor is present in the process chamber at a relatively low partial pressure, e.g., between about 0.01 Torr and about 1.0 Torr. In certain embodiments, the hydrocarbon precursor partial pressure is at or below about 0.2 Torr. In some embodiments, the hydrocarbon precursor partial pressure is less than about 1%, about 1%, about 1.5%, about 2.0%, about 2.5%, about 3.0%, about 3.5%, about 4.0%, about 4.5%, about 5.0%, about 5.5%, about 6.0%, or more than about 6.0% of the total pressure in the process chamber.

In some embodiments, the hydrocarbon precursor is one defined by the formula $C_xH_y$, wherein X is an integer between 2 and 10, and Y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). In certain embodiments the hydrocarbon precursor is a halogenated hydrocarbon, where one or more hydrogen atoms are replaced by a halogen, particularly fluorine, chlorine, bromine, and/or iodine. In some embodiments the hydrocarbon precursor comprises compounds having a molecular weight of at most about 50 g/mol. In some embodiments the hydrocarbon precursor has a ratio of C:H of at least 1:2. In some embodiments the hydrocarbon precursor is acetylene ($C_2H_2$). In some embodiments, two or more hydrocarbon precursors may be used.

In some embodiments, an inert gas is used that comprises at least about 50% or at least about 80% or at least about 95% helium by volume of all inert gas used. In some embodiments the inert gas is helium substantially without any other inert gas.

Precursor gas volumetric flow rates depend on the particular process chamber, substrate, and other process conditions. Examples of volumetric flow rates that may be used for a single 300 mm substrates are between about 10 sccm and about 1,000 sccm of acetylene and between about 250 sccm and about 5,000 sccm of helium. In some embodiments the flow rate of acetylene is between about 1% and about 3% of the total flow rate and helium comprises the rest of the total flow rate. In some embodiments the volumetric flow is between about 15 sccm and about 45 sccm $C_2H_2$, and between about 1455 sccm and about 1485 sccm helium. In some embodiments the volumetric flow is between about 18 sccm and about 20 sccm $C_2H_2$, and between about 1480 sccm and about 1482 sccm helium, all values per 300 mm substrate. In some embodiments the volumetric flow rate is between about 40 sccm and about 45 sccm $C_2H_2$, and between about 1455 sccm and about 1460 sccm helium. Unless otherwise specified, the flow rates disclosed herein are for a single station tool configured for 300 mm wafers. Flow rates may scale linearly with the number of stations and substrate area.

The AHM film deposition methods described herein may be performed at any appropriate process temperature to obtain desired AHM characteristics, with examples ranging from about 50° C. to about 550° C. In some embodiments the process temperature is between about 100° C. and about 200° C. In some embodiments the process temperature is between about 150° C. and about 175° C. Process temperature can affect the stress, selectivity, and transparency at least in part due to $sp^2$ bond versus sp a bond formation. Higher temperatures favor $sp^2$ rich amorphous carbon network formation as the high temperatures enable easy breakage of C—H bonds and subsequent diffusion of hydrogen. For example, films deposited at temperatures above about 500° C. may have significantly more $sp^2$ CH and $CH_2$ bonds and relatively fewer sp a bonds, which have increased carbon content and higher density, and correlate with increased etch selectivity. However, these $sp^2$-rich films may not be suitable for thick hard mask applications. For example, at 2,000 Å and above, the films may not be transparent enough for mask alignment. 633 nm lasers may be used for transparent films and semi-transparent films but not for more opaque films such as produced at high temperatures. AHM films deposited at lower temperatures, e.g., below about 400° C. may have more less $sp^2$ bonding compared to films deposited at higher temperatures.

In some embodiments, low frequency (LF) RF power refers to an RF power having a frequency between about 100 kHz and about 2 MHz. In some embodiments, pulsing frequency may be limited by the operation capability of the LF generator. In some embodiments, LF RF power has an RF power with a frequency of about 400 kHz, for example 430 kHz. High frequency RF power refers to an RF power having a frequency between about 2 MHz and about 60 MHz. In some embodiments, HF RF power has an RF power with a frequency of about 13.56 MHz.

In some embodiments, HF and LF RF components can be pulsed in a synchronized manner. If an HF component is pulsed, it is pulsed from high to low power and not turned off to avoid plasma sheath collapse. In some embodiments, pulsing only LF RF power may be advantageous to form more stable plasma.

In some embodiments, the LF power is pulsed while HF power is constant. In various embodiments, the LF power is pulsed by switching the LF power on and off. In some embodiments, the LF 'on' power is at least 3000 W per 300 mm substrate. In some embodiments the LF on power is between about 3500 W and about 6500 W per 300 mm substrate. In some embodiments, the LF 'off' power is OW. In various embodiments, the LF power is pulsed by switching the LF between non-zero power levels, such that the LF off power is between OW and the LF on power. In some embodiments, the LF power is pulsed between about 1000 W and about 6000 W. In some embodiments, the HF power per substrate ranges between about OW and about 150 W per 300 mm substrate. In some embodiments, the HF power per substrate ranges between about OW and about 800 W. In many embodiments, the minimum power of the HF RF component and the minimum power of the LF RF component are sufficient to maintain a plasma. All powers provided herein are per 300 mm substrate. RF power as described herein generally scales linearly with number of stations and area of wafers. The power values may be represented on a per area basis, e.g., 2500 W may also be represented as 0.884 $W/cm^2$.

Duty cycle (DC) for LF pulsing may range from about 10% to about 90%. In some embodiments the DC is between about 10% and about 50%, between about 10% and about 30%, or between about 10% and about 20%. In some embodiments the DC is between about 60% and about 90%, or between about 60% and about 75%. In various embodiments, the LF power is pulsed at a frequency of between about 100 Hz and about 1000 Hz. In some embodiments, the LF power is pulsed at a frequency of between about 50 Hz and about 2000 Hz. In some embodiments, the LF power is pulsed at a frequency of at least about 200 Hz, or at least about 300 Hz. In some embodiments the DC and pulse frequency are set so that the LF power on time duration is between about 200 μs and about 2500 μs and the LF power off time duration is between about 800 μs and about 7500 μs. In some embodiments the LF power has an on period for a duration between about 200 μs and about 300 μs.

In some embodiments the gap between the pedestal and the showerhead is at least 0.65" (inches), between 0.65" and 0.75", approximately 0.75", between 0.75" and 0.85", approximately 0.85", between 0.85" and 0.95", approximately 0.95", between 0.95" and 1.05", approximately 1.05", between 1.05" and 1.15", approximately 1.15", between 1.15" and 1.25", approximately 1.25", between 1.25" and 1.35", approximately 1.35", between 1.35" and 1.45", approximately 1.45", between 1.45" and 1.55", approximately 1.55", or more than 1.55". As the RF power of the plasma increases and/or the operating pressure is reduced, the gap between the pedestal and the showerhead may be increased without reducing the quality of the deposited AHM.

In some processes herein the AHM film deposits at a rate of at least 700 Å/min. In some embodiments the AHM film deposits at a rate of between about 700 Å/min and about 900 Å/min. The deposition rate of the AHM film may depend various factors including the DC, as a longer mean 'on' time for the LF power will increase the deposition rate.

In some embodiments, the process conditions for depositing an AHM film include pulsing the LF power with at least about 3000 W per 300 mm wafer, with a duty cycle between about 10% and about 75%, and an inert gas that is substantially helium. In some embodiments, the process conditions include pulsing the LF power with at least 6000 W per 300 mm wafer, with a duty cycle between 10% and 75%, and an inert gas that is substantially helium. In some embodiments, the process conditions include pulsing the LF power with at least about 3000 W per 300 mm wafer, with a duty cycle between 10% and 40%, and an inert gas that is substantially helium.

Film Properties

AHM films produced in accordance with the disclosed methods are typically composed primarily of carbon and hydrogen, but other elements may be present in the film. Generally, the lower the atomic percent of hydrogen in the mask, the higher the modulus and selectivity. In some embodiments other elements may be added to the gas mixture, for example, if a halogenated hydrocarbon is used, the halogen may comprise a percentage of the film composition. In some embodiments, the hydrogen concentration is at most about 25 percent atomic. In some embodiments, the hydrogen concentration is between about 24 and 25 percent atomic. In some embodiments the carbon concentration is at least about 70 percent atomic. In some embodiments the carbon concentration is between about 70 and 76 percent atomic. Examples of other elements that may be present in the AHM film include halogens, nitrogen, sulfur, boron, oxygen, tungsten, titanium, and aluminum. Typically, such other elements are present in amounts not greater than about 10 percent atomic.

In some embodiments, an AHM film produced in accordance with the methods describe herein has an internal stress magnitude of at most about −1400 MPa, or between about −200 MPa and about −1400 MPa. (negative internal stress denotes a compressive stress, such that lower values have less internal stress) In some embodiments, the AHM film has an elastic modulus of at least about 80 GPa, or between about 145 GPa and 160 GPa. In some embodiments, the AHM film has a hardness of at least about 9 GPa, or between about 15 GPa and about 17 GPa. In some embodiments, the AHM film has a density of at least about 1.5 g/cm 3, or between about 1.8 g/cm 3 and about 1.9 g/cm 3.

In some embodiments an AHM film produced in accordance with the methods described herein has an extinction coefficient at 633 nm of at most about 0.4. The extinction coefficient may correlate with the ability of light to move through the AHM film, or the transparency of the film. In some embodiments, AHM films are transparent or translucent. AHM films without sufficiently low values of extinction coefficient may require additional operations in a later etch process to etch the AHM film, which is undesirable.

In some embodiments the thickness of an AHM film deposited in accordance with methods disclosed herein is between about 100 nm and about 2500 nm. Generally, the desired thickness of an AHM film may vary depending on the thickness of the underlying layers to be etched and the etch selectivity of the AHM, with thicker underlying layers to be etched requiring a thicker AHM. As discussed above, AHM films are used to etch a variety of underlying materials, and may have a different etch selectivity for each material. Etch selectivity of an AHM can be represented as a ratio of the etch rate of a material and the etch rate of the AHM, and may vary for different materials and etch chemistries.

Applications

AHMs are typically used for creating features of semiconductor devices by etching one or more underlying layers of a substrate. Materials that may be etched using an AHM may include silicon (single crystal, polysilicon, or amorphous silicon), silicon oxide, silicon nitride, and tungsten. In some embodiments multiple layers are stacked and etched using a single AHM. Examples of such stacks include a layer of silicon and a layer of silicon oxide, and a layer of tungsten and a layer of silicon nitride. In some embodiments a stack includes repeating layers that are etched using a single AHM. Examples of such repeating layers include repeating layers of silicon oxide/polysilicon (OPOP). Front end of line and back end of line features may be etched using an AHM as disclosed herein. Memory or logic device features may be patterned. Examples of memory devices include: DRAM, NAND, and 3D NAND.

Apparatus

Embodiments can be implemented in a plasma enhanced chemical vapor deposition (PECVD) reactor. Such a reactor may take many different forms. Various embodiments are compatible with existing semiconductor processing equipment—in particular, PECVD reactors such as Sequel™ or Vector™ reactor chambers available from Lam Research Corporation. The various embodiments may be implemented on a multi-station or single station tool. In specific embodiments, the 300 mm Lam Vector™ tool having a 4-station deposition scheme or the 200 mm Sequel™ tool having a 6-station deposition scheme are used.

Generally, the apparatus will include one or more chambers or reactors that each include one or more stations. Chambers will house one or more wafers and are suitable for wafer processing. The one or more chambers maintain the wafer in a defined position or positions, by preventing rotation, vibration, or other agitation. In some embodiment, a wafer undergoing AHM deposition is transferred from one station to another within a chamber during the process. For example, a 2000 Å AHM deposition may occur entirely at one station, or 500 Å of film may be deposited at each of four stations in accordance with various embodiments. Alternatively, any other fraction of the total film thickness may be deposited at any number of stations. In various embodiments where more than one AHM is deposited, more than one station may be used to deposit each AHM layer. During processing, each wafer is held in place by a pedestal, wafer chuck, and/or other wafer holding apparatus. For certain operations where the wafer is to be heated, the apparatus may include a heater such as a heating plate.

Figure 6:
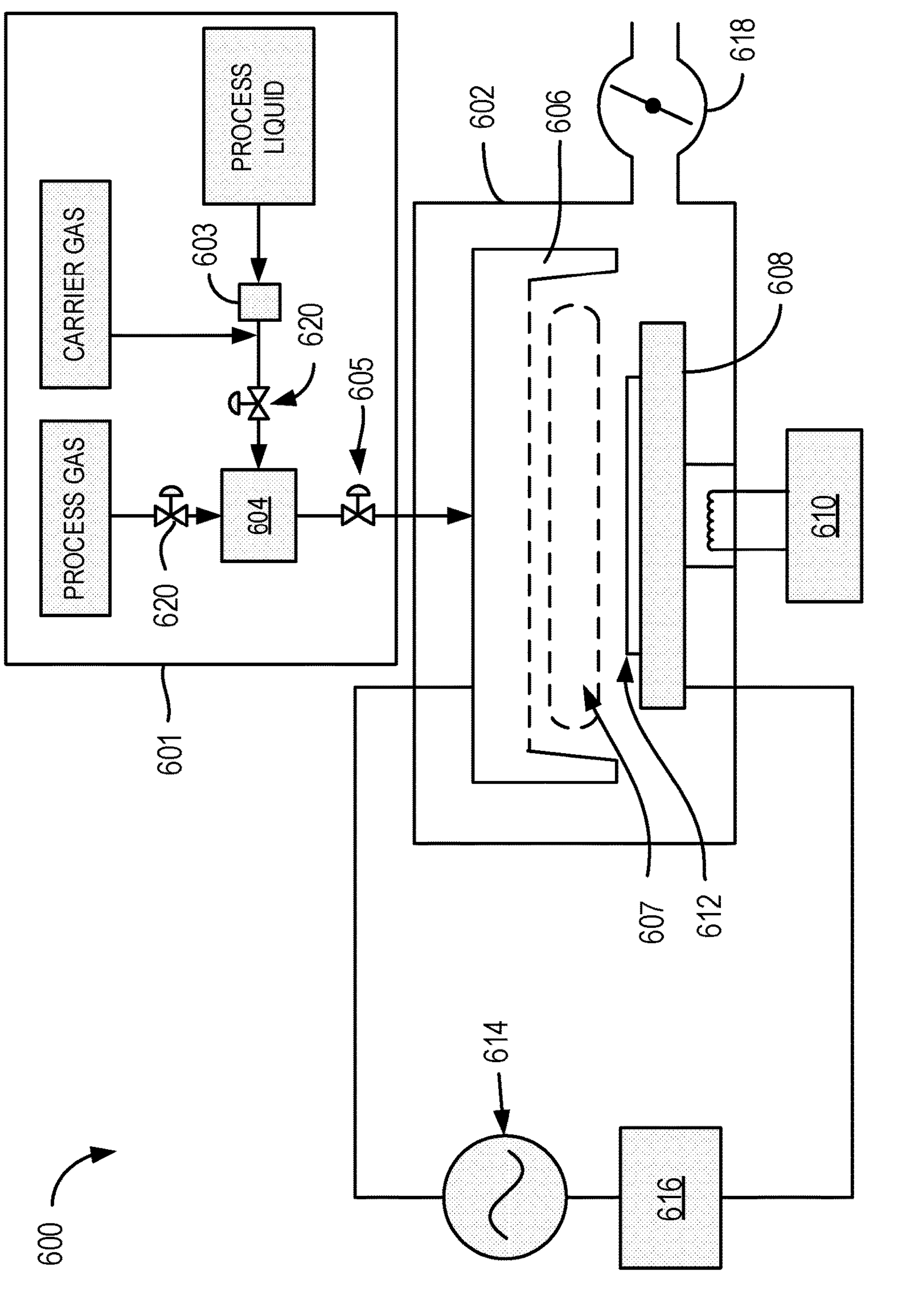
FIG. 6 shows another schematic illustration of another plasma enhanced chemical vapor deposition (PECVD) chamber suitable for practicing various embodiments.

FIG. 6 schematically shows an embodiment of a process station 600 that may be used to deposit material using plasma enhanced chemical vapor deposition (PECVD). For simplicity, the process station 600 is depicted as a standalone process station having a process chamber body 602 for maintaining a low-pressure environment. However, it will be appreciated that a plurality of process stations 600 may be included in a common process tool environment. Further, it will be appreciated that, in some embodiments, one or more hardware parameters of process station 600, including those discussed in detail below, may be adjusted programmatically by one or more computer controllers.

Process station 600 fluidly communicates with reactant delivery system 601 for delivering process gases to a distribution showerhead 606. Reactant delivery system 601 includes a mixing vessel 604 for blending and/or conditioning process gases for delivery to showerhead 606. One or more mixing vessel inlet valves 620 may control introduction of process gases to mixing vessel 604. Similarly, a showerhead inlet valve 605 may control introduction of process gasses to the showerhead 606.

For example, the embodiment of FIG. 6 includes a vaporization point 603 for vaporizing liquid reactant to be supplied to mixing vessel 604. In some embodiments, vaporization point 603 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100° C. to approximately 150° C. at mixing vessel 604.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller upstream of vaporization point 603 may be provided for controlling a mass flow of liquid for vaporization and delivery to process station 600. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 606 distributes process gases toward substrate 612. In the embodiment shown in FIG. 6, substrate 612 is located beneath showerhead 606, and is shown resting on a pedestal 608. It will be appreciated that showerhead 606 may have any suitable shape, and may have any suitable number and arrangement of ports for distributing processes gases to substrate 612.

In some embodiments, a microvolume 607 is located beneath showerhead 606. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 608 may be raised or lowered to adjust the size of the gap between pedestal 608 and showerhead 606 (e.g., as discussed in connection with FIGS. 5 and 6). Lowering or raising pedestal 608 may also be done to expose substrate 612 to microvolume 607 and/or to vary a volume of microvolume 607. For example, in a substrate transfer phase, pedestal 608 may be lowered to allow substrate 612 to be loaded onto pedestal 608. During a deposition process phase, pedestal 608 may be raised to position substrate 612 within microvolume 607 and/or to configure the chamber with a desired wide gap spacing between pedestal 608 and showerhead 606, which may reduce parasitic plasmas when depositing AHMs in low-pressure PECVD operations. In some embodiments, microvolume 607 may completely enclose substrate 612 as well as a portion of pedestal 608 to create a region of high flow impedance during a deposition process.

Optionally, pedestal 608 may be lowered and/or raised during portions the deposition process to modulate process pressure, reactant concentration, etc., within microvolume 607. In one scenario where process chamber body 602 remains at a base pressure during the deposition process, lowering pedestal 608 may allow microvolume 607 to be evacuated. Example ratios of microvolume to process chamber volume include, but are not limited to, volume ratios between 1:700 and 1:10. It will be appreciated that, in some embodiments, pedestal height may be adjusted programmatically by a suitable computer controller.

In some embodiments, RF power is applied to showerhead 606, while pedestal 608 is grounded, to generate plasmas. In some other embodiments, showerhead 606 is grounded, while RF power is applied to pedestal 608 to generate plasmas.

In another scenario, adjusting a height of pedestal 608 may allow a plasma density to be varied during plasma activation and/or treatment cycles included in the deposition process. At the conclusion of the deposition process phase, pedestal 608 may be lowered during another substrate transfer phase to allow removal of substrate 612 from pedestal 608.

While the example variations described herein refer to a height-adjustable pedestal, it will be appreciated that, in some embodiments, a position of showerhead 606 may be adjusted relative to pedestal 608 to vary the gap between pedestal 608 and showerhead 606 (e.g., to reduce or eliminate parasitic plasmas and/or to vary a volume of microvolume 607). Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers.

Returning to the embodiment shown in FIG. 6, showerhead 606 and pedestal 608 electrically communicate with RF power supply 614 and matching network 616 for powering a plasma. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Examples of suitable powers are included above. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 50 kHz and 700 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a hydrocarbon precursor gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some embodiments, pedestal 608 may be temperature controlled via heater 610. Further, in some embodiments, pressure control for deposition process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to process station 600.

Figure 7:
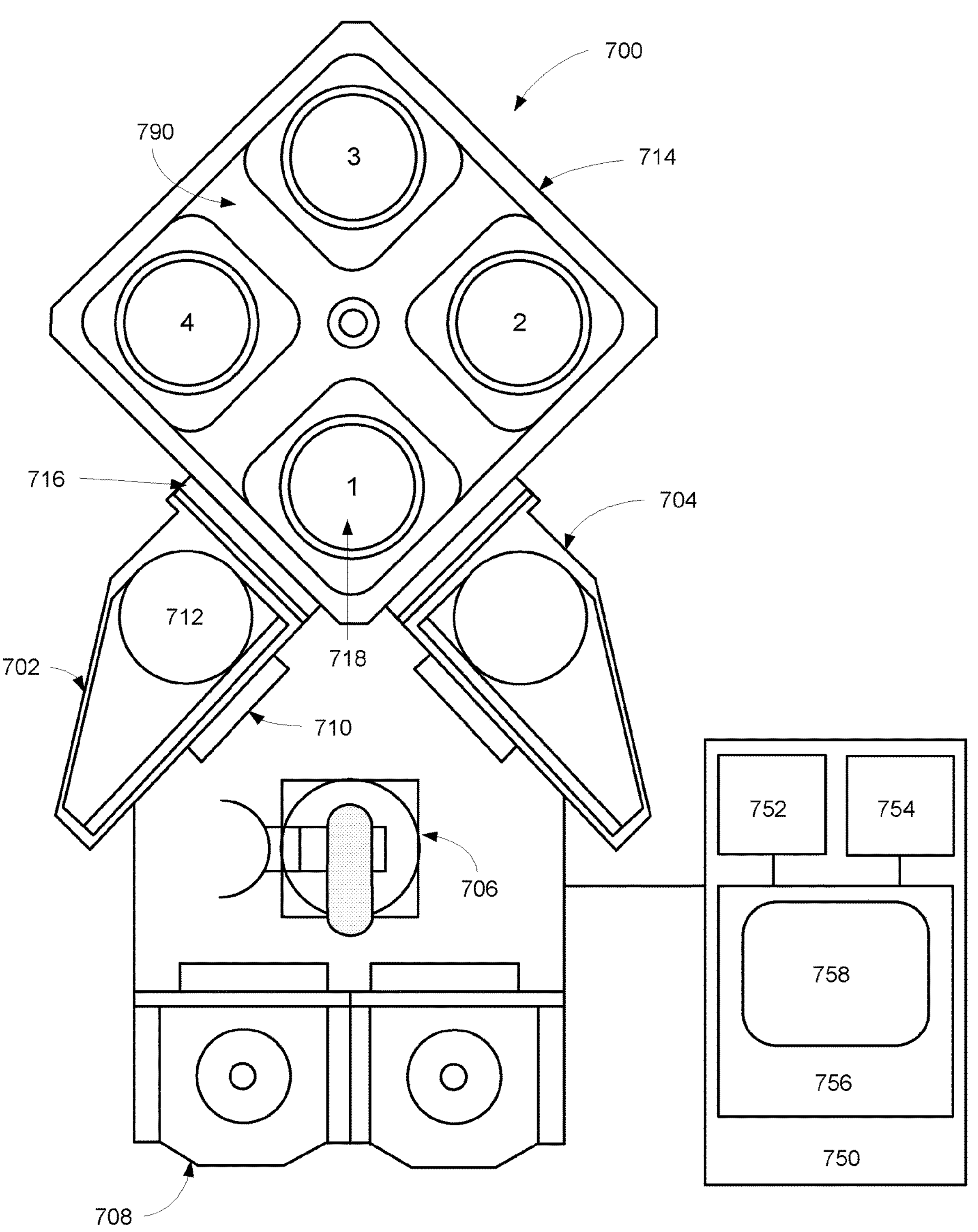
FIG. 7 shows another schematic illustration of another plasma enhanced chemical vapor deposition (PECVD) chamber suitable for practicing various embodiments.

FIG. 7 shows a schematic view of an embodiment of a multi-station processing tool 700 with an inbound load lock 702 and an outbound load lock 704, either or both of which may comprise a remote plasma source. A robot 706, at atmospheric pressure, is configured to move wafers from a cassette loaded through a pod 708 into inbound load lock 702 via an atmospheric port 710. A wafer is placed by the robot 706 on a pedestal 712 in the inbound load lock 702, the atmospheric port 710 is closed, and the load lock is pumped down. Where the inbound load lock 702 comprises a remote plasma source, the wafer may be exposed to a remote plasma treatment in the load lock prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 comprises four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. While the depicted processing chamber 714 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 also depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. System control software 758 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 700. System control software 758 may be configured in any suitable way. For example, various process tool component subroutines or control objects may be written to control operation of the process tool components necessary to carry out various process tool processes in accordance with the disclosed methods. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700. The substrate positioning program may also include program code for process control components that are used to adjust the gap, in each process station, between the showerhead and pedestal of that process station.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS ° product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 8:
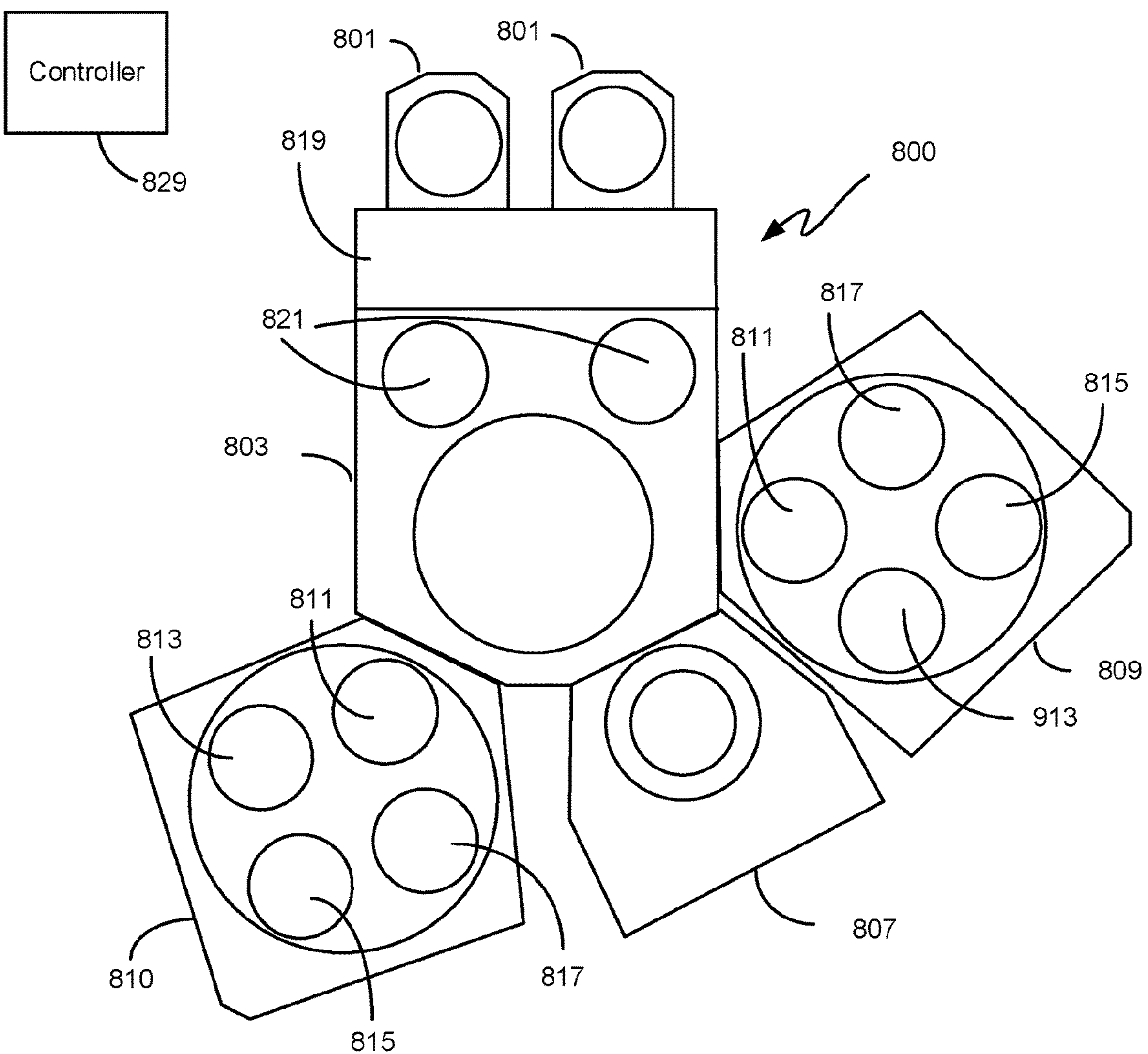
FIG. 8 shows a schematic illustration of a module cluster suitable for practicing various embodiments.

FIG. 8 is a block diagram of a processing system suitable for conducting thin film deposition processes in accordance with certain embodiments. The system 800 includes a transfer module 803. The transfer module 803 provides a clean, pressurized environment to minimize risk of contamination of substrates being processed as they are moved between various reactor modules. Mounted on the transfer module 803 are two multi-station reactors 809 and 810, each capable of performing atomic layer deposition (ALD) and/or chemical vapor deposition (CVD) according to certain embodiments. Reactors 809 and 810 may include multiple stations 811, 813, 815, and 817 that may sequentially or non-sequentially perform operations in accordance with disclosed embodiments. The stations may include a heated pedestal or substrate support, one or more gas inlets or showerhead or dispersion plate.

Also mounted on the transfer module 803 may be one or more single or multi-station modules 807 capable of performing plasma or chemical (non-plasma) pre-cleans, or any other processes described in relation to the disclosed methods. The module 807 may in some cases be used for various treatments to, for example, prepare a substrate for a deposition process. The module 807 may also be designed/configured to perform various other processes such as etching or polishing. The system 800 also includes one or more wafer source modules 801, where wafers are stored before and after processing. An atmospheric robot (not shown) in the atmospheric transfer chamber 819 may first remove wafers from the source modules 801 to loadlocks 821. A wafer transfer device (generally a robot arm unit) in the transfer module 803 moves the wafers from loadlocks 821 to and among the modules mounted on the transfer module 803.

In various embodiments, a system controller 829 is employed to control process conditions during deposition. The controller 829 will typically include one or more memory devices and one or more processors. A processor may include a CPU or computer, analog and/or digital input/output connections, stepper motor controller boards, etc.

The controller 829 may control all of the activities of the deposition apparatus. The system controller 829 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 829 may be employed in some embodiments.

Typically there will be a user interface associated with the controller 829. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 829. The signals for controlling the process are output on the analog and digital output connections of the deposition apparatus 800.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 829 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 829, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. In other instances, well-known process operations have not been described in detail to not unnecessarily obscure the disclosed embodiments. Accordingly, the present embodiments are to be considered as illustrative and not restrictive, and the embodiments are not to be limited to the details given herein.

What is claimed is:

1. A method of forming an ashable hard mask (AHM) film, comprising:

exposing a substrate to a process gas at a pressure of about 1 Torr or less, the process gas comprising a hydrocarbon precursor gas; and depositing on the substrate an AHM film by a plasma enhanced chemical vapor deposition (PECVD) process, wherein the PECVD process comprises igniting a plasma between a showerhead and a pedestal, wherein the showerhead and the pedestal are separated by a gap of about 0.85 inches or more.

2. The method of claim 1, wherein the hydrocarbon precursor gas comprises compounds having a molecular weight of at most about 50 g/mol.

3. The method of claim 1, wherein the hydrocarbon precursor gas comprises compounds having a C:H ratio of at least about 0.5.

4. The method of claim 1, wherein the hydrocarbon precursor gas comprises acetylene ($C_2H_2$).

5. The method of claim 1, wherein the hydrocarbon precursor gas has a partial pressure between about 1% and about 5% of a pressure of the process gas.

6. The method of claim 1, wherein the method is performed in a multi-station reactor.

7. The method of claim 1, wherein the method is performed in a single-station reactor.

8. The method of claim 1, wherein an internal stress of the AHM film is at most about −1400 MPa.

9. The method of claim 1, wherein a modulus of the AHM film is at least about 80 GPa.

10. The method of claim 1, wherein a density of the AHM film is at least about 1.5 g/cm$^3$.

11. The method of claim 1, further comprising patterning the deposited AHM film and etching the patterned AHM film to define features of the AHM film in the substrate.

12. The method of claim 11, further comprising etching layers in the substrate underlying the AHM film.

13. The method of claim 1, further comprising, prior to depositing on the substrate the AHM film, translating the pedestal relative to the showerhead such that the showerhead and the pedestal are separated by the gap of about 0.85 inches or more.

14. The method of claim 1, wherein the plasma is substantially confined between the showerhead and the pedestal.

* * * * *